United States Patent
Kando

(10) Patent No.: US 9,837,598 B2
(45) Date of Patent: Dec. 5, 2017

(54) PIEZOELECTRIC BULK WAVE DEVICE, AND METHOD OF MANUFACTURING THE PIEZOELECTRIC BULK WAVE DEVICE

(71) Applicant: MURATA MANUFACTURING CO., LTD., Nagaokakyo-shi, Kyoto-Fu (JP)

(72) Inventor: Hajime Kando, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 577 days.

(21) Appl. No.: 14/193,513

(22) Filed: Feb. 28, 2014

(65) Prior Publication Data
US 2014/0175945 A1      Jun. 26, 2014

Related U.S. Application Data

(63) Continuation of application No. PCT/JP2012/071576, filed on Aug. 27, 2012.

(30) Foreign Application Priority Data

Sep. 1, 2011   (JP) .................................. 2011-190342

(51) Int. Cl.
*H01L 41/187* (2006.01)
*H03H 3/02* (2006.01)
(Continued)

(52) U.S. Cl.
CPC ...... *H01L 41/1871* (2013.01); *H01L 41/0477* (2013.01); *H01L 41/29* (2013.01);
(Continued)

(58) Field of Classification Search
CPC .. H01L 41/1871; H01L 41/0477; H01L 41/29
(Continued)

(56) References Cited

U.S. PATENT DOCUMENTS

2001/0045793 A1* 11/2001 Misu ........................ H03H 3/04
310/364
2004/0053435 A1*  3/2004 Ikushima .............. B81B 3/0072
438/57
(Continued)

FOREIGN PATENT DOCUMENTS

CN          1435320 A      8/2003
JP       2000-209063 A     7/2000
(Continued)

OTHER PUBLICATIONS

PCT/JP2012/071576 Written Opinion dated Sep. 20, 2012.

*Primary Examiner* — Bryan Gordon
(74) *Attorney, Agent, or Firm* — Arent Fox LLP

(57) ABSTRACT

A piezoelectric bulk wave device that includes a piezoelectric thin plate that is made of $LiTaO_3$, and first and second electrodes that are provided in contact with the piezoelectric thin plate. The piezoelectric bulk wave device utilizes the thickness shear mode of the piezoelectric thin plate made of $LiTaO_3$. The first and second electrodes are each formed by a conductor having a specific acoustic impedance higher than the specific acoustic impedance of a transversal wave that propagates in $LiTaO_3$. When the sum of the film thicknesses of the first and second electrodes is defined as an electrode thickness, and the thickness of the piezoelectric thin plate made of $LiTaO_3$ is defined as an LT thickness, the electrode thickness/(electrode thickness+LT thickness) is not less than 5% and not more than 40%.

16 Claims, 19 Drawing Sheets

(51) Int. Cl.
*H03H 9/02* (2006.01)
*H03H 9/05* (2006.01)
*H01L 41/047* (2006.01)
*H01L 41/29* (2013.01)
*H03H 9/17* (2006.01)

(52) U.S. Cl.
CPC .......... *H03H 3/02* (2013.01); *H03H 9/02157* (2013.01); *H03H 9/0595* (2013.01); *H03H 9/173* (2013.01); *Y10T 29/42* (2015.01)

(58) Field of Classification Search
USPC ........................................ 310/321, 365, 351
See application file for complete search history.

(56) References Cited

U.S. PATENT DOCUMENTS

| | | | |
|---|---|---|---|
| 2005/0146243 A1* | 7/2005 | Cherednick | H03H 9/0259 310/313 A |
| 2005/0179508 A1 | 8/2005 | Sato | |
| 2005/0269904 A1 | 12/2005 | Oka | |
| 2006/0214539 A1 | 9/2006 | Sato | |
| 2006/0262165 A1 | 11/2006 | Murai | |
| 2007/0200458 A1 | 8/2007 | Yoshino et al. | |
| 2009/0102319 A1 | 4/2009 | Nakatsuka et al. | |
| 2012/0096941 A1* | 4/2012 | Yoneda | G01C 19/5656 73/504.12 |
| 2012/0104897 A1 | 5/2012 | Nishiyama et al. | |
| 2013/0127300 A1* | 5/2013 | Umeda | H01L 41/18 310/365 |
| 2013/0285768 A1* | 10/2013 | Watanabe | H03H 9/0222 333/193 |

FOREIGN PATENT DOCUMENTS

| | | |
|---|---|---|
| JP | 2005-236518 A | 9/2005 |
| JP | 2006-020277 A | 1/2006 |
| JP | 2006-270506 A | 10/2006 |
| JP | 2007-228356 A | 9/2007 |
| JP | 2010-166203 A | 7/2010 |
| JP | 2011-124738 A | 6/2011 |
| WO | WO-2007-004435 A1 | 1/2007 |
| WO | WO-2010-101026 A1 | 9/2010 |
| WO | Wo 2011/007690 A | 1/2011 |

* cited by examiner

UPPER ELECTRODE THICKNESS = LOWER ELECTRODE THICKNESS (μm)

UPPER ELECTRODE THICKNESS = LOWER ELECTRODE THICKNESS (μm)

UPPER ELECTRODE THICKNESS = LOWER ELECTRODE THICKNESS (μm)

θ OF EULER ANGLES (DEGREES)

US 9,837,598 B2

PIEZOELECTRIC BULK WAVE DEVICE, AND METHOD OF MANUFACTURING THE PIEZOELECTRIC BULK WAVE DEVICE

CROSS REFERENCE TO RELATED APPLICATIONS

The present application is a continuation of International application No. PCT/JP2012/071576, filed Aug. 27, 2012, which claims priority to Japanese Patent Application No. 2011-190342, filed Sep. 1, 2011, the entire contents of each of which are incorporated herein by reference.

FIELD OF THE INVENTION

The present invention relates to a piezoelectric bulk wave device using $LiTaO_3$, and a method of manufacturing the piezoelectric bulk wave device. More specifically, the present invention relates to a piezoelectric bulk wave device that utilizes a bulk wave of thickness shear mode as a bulk wave, and a method of manufacturing the piezoelectric bulk wave device.

BACKGROUND OF THE INVENTION

In related art, piezoelectric thin film devices are used for oscillators, filters, and the like. For example, a piezoelectric thin film device illustrated in FIG. 24 is disclosed in Patent Document 1 mentioned below. A piezoelectric thin film device 1001 has a piezoelectric thin film 1002. It is described in Patent Document 1 that the piezoelectric thin film 1002 is desirably made of piezoelectric monocrystal, such as quartz crystal, $LiTaO_3$, or $LiNbO_3$. Electrodes 1003 and 1004 are formed on the upper surface of the piezoelectric thin film 1002. Electrodes 1005 to 1007 are formed on the lower surface of the piezoelectric thin film 1002. By using the electrodes 1003 to 1007, four piezoelectric thin film resonators that utilize thickness shear mode are formed in the piezoelectric thin film device 1001.

Patent Document 1: Japanese Unexamined Patent Application Publication No. 2007-228356

SUMMARY OF THE INVENTION

As described in Patent Document 1, in related art, piezoelectric thin film devices using the thickness shear mode of $LiTaO_3$ are known. However, in a case where the thickness shear mode is utilized by using a piezoelectric thin film made of $LiTaO_3$, it is difficult to obtain good electrical characteristics. Moreover, manufacturing variations in $LiTaO_3$ or electrode film thickness tend to lead to large variations in electrical characteristics.

It is an object of the present invention to provide a piezoelectric bulk wave device that utilizes the thickness shear mode of $LiTaO_3$, and exhibits relatively small variations in electrical characteristics caused by variations in electrode film thickness or in the thickness of $LiTaO_3$, and a method of manufacturing the piezoelectric bulk wave device.

A piezoelectric bulk wave device according to the present invention utilizes the thickness shear mode of a piezoelectric thin plate made of $LiTaO_3$. The piezoelectric bulk wave device according to the present invention has a piezoelectric thin plate that is made of $LiTaO_3$, and first and second electrodes that are provided in contact with the piezoelectric thin plate. According to the present invention, the first and second electrodes are each formed by a conductor having a specific acoustic impedance higher than a specific acoustic impedance of a transversal wave that propagates in $LiTaO_3$, and when a sum of film thicknesses of the first and second electrodes is defined as an electrode thickness, and a thickness of the piezoelectric thin plate made of $LiTaO_3$ is defined as an LT thickness, the electrode thickness/(electrode thickness+LT thickness) is in a range of not less than 5% and not more than 40%.

In a specific aspect of the piezoelectric bulk wave device according to the present invention, each of the first and second electrodes is at least one metal selected from the group consisting of W, Mo, Pt, and Ta or an alloy mainly including the metal, or a laminate including the metal that accounts for more than half of the laminate in weight ratio.

A method of manufacturing a piezoelectric bulk wave device according to the present invention is a method of manufacturing a piezoelectric bulk wave device that utilizes a thickness shear mode of a piezoelectric thin plate made of $LiTaO_3$, and includes the steps of preparing a piezoelectric thin plate, forming a first electrode in contact with the piezoelectric thin plate, the first electrode being formed by a conductor having a specific acoustic impedance higher than a specific acoustic impedance of a transversal wave that propagates in $LiTaO_3$, the first electrode being configured so that an electrode thickness/(electrode thickness+LT thickness) is not less than 5% and not more than 40%, and forming a second electrode in contact with the piezoelectric thin plate, the second electrode being formed by a conductor having a specific acoustic impedance higher than the specific acoustic impedance of the transversal wave that propagates in $LiTaO_3$, the second electrode being configured so that an electrode thickness/(electrode thickness+LT thickness) is not less than 5% and not more than 40%.

In a specific aspect of the method of manufacturing a piezoelectric bulk wave device according to the present invention, the step of preparing the piezoelectric thin plate includes the steps of implanting ions from one side of a piezoelectric substrate made of $LiTaO_3$ to form a high concentration ion-implanted portion on the one side, the high concentration ion-implanted portion being a portion of highest implanted-ion concentration, joining a support substrate to the one side of the piezoelectric substrate, and separating the piezoelectric substrate at the high concentration ion-implanted portion while heating the piezoelectric substrate, into a piezoelectric thin plate that extends from the one side of the piezoelectric substrate to the high concentration ion-implanted portion, and a remaining piezoelectric substrate portion.

In this case, the position of the high concentration ion-implanted portion can be easily controlled by selecting the above-mentioned ion implantation conditions. Generally, an ion beam from an ion implantation device is linearly applied to the substrate with uniform intensity, and the ion beam is applied a number of times at substantially the same irradiation angle to the same location while scanning the entire substrate. Accordingly, in comparison to thickness variations due to film deposition methods such as sputtering, CVD, and evaporation, by using ion implantation, the position of the high concentration ion-implanted portion becomes uniform over the entire substrate surface, leading to smaller variations in depth. Therefore, it is possible to easily obtain a piezoelectric thin plate with an accurate thickness over the entire substrate surface.

In another specific aspect of the method of manufacturing a piezoelectric bulk wave device according to the present invention, the step of preparing the piezoelectric thin plate includes the steps of implanting ions from one side of a piezoelectric substrate made of LiTaO$_3$ to form a high concentration ion-implanted portion on the one side, the high concentration ion-implanted portion being a portion of highest implanted-ion concentration, bonding a temporary support member onto the one side of the piezoelectric substrate, and separating the piezoelectric substrate at the high concentration ion-implanted portion while heating the piezoelectric substrate bonded on the temporary support member, into a piezoelectric thin plate that extends from the one side of the piezoelectric substrate to the high concentration ion-implanted portion, and a remaining piezoelectric substrate portion, and the method includes the step of detaching the temporary support member from the piezoelectric thin plate.

In this case, it is possible to reduce the possibility of a defect occurring in the piezoelectric thin plate due to thermal stress exerted when separating the piezoelectric thin plate.

In still another specific aspect of the method of manufacturing a piezoelectric bulk wave device according to the present invention, prior to detaching the temporary support member from the piezoelectric thin plate, the steps of forming a first electrode on the piezoelectric thin plate, forming a dummy layer so as to cover the first electrode, and laminating a support substrate on the dummy layer are performed. In addition, the method further includes the steps of, after detaching the temporary support member from the piezoelectric thin plate, forming a second electrode on another side of the piezoelectric thin plate which is exposed by the detaching of the temporary support member, and causing the dummy layer to disappear. In this case, in accordance with the present invention, it is possible to provide a piezoelectric bulk wave device having a structure in which a vibrating part having the first and second electrodes formed on the top and the bottom of the piezoelectric thin plate is made afloat from the support substrate.

According to the present invention, the first and second electrodes are each formed by a conductor having a specific acoustic impedance higher than the specific acoustic impedance of a transversal wave that propagates in LiTaO$_3$, and when the sum of the film thicknesses of the first and second electrodes is defined as an electrode thickness, and the thickness of the piezoelectric thin plate made of LiTaO$_3$ is defined as an LT thickness, the electrode thickness/(electrode thickness+LT thickness) is in the range of not less than 5% and not more than 40%. Therefore, it is possible to provide a piezoelectric bulk wave device that exhibits relatively small fluctuations in electromechanical coupling coefficient. Accordingly, it is possible to provide a piezoelectric bulk wave device with relatively small variations in characteristics.

In the method of manufacturing a piezoelectric bulk wave device according to the present invention, the first and second electrodes are configured in the manner as mentioned above. Therefore, in accordance with the present invention, it is possible to provide a piezoelectric bulk wave device with relatively small variations in characteristics.

DETAILED DESCRIPTION OF THE PREFERRED EMBODIMENTS

Hereinafter, the present invention will be explained by way of specific embodiments of the present invention with reference to the drawings.

Figure 1A:
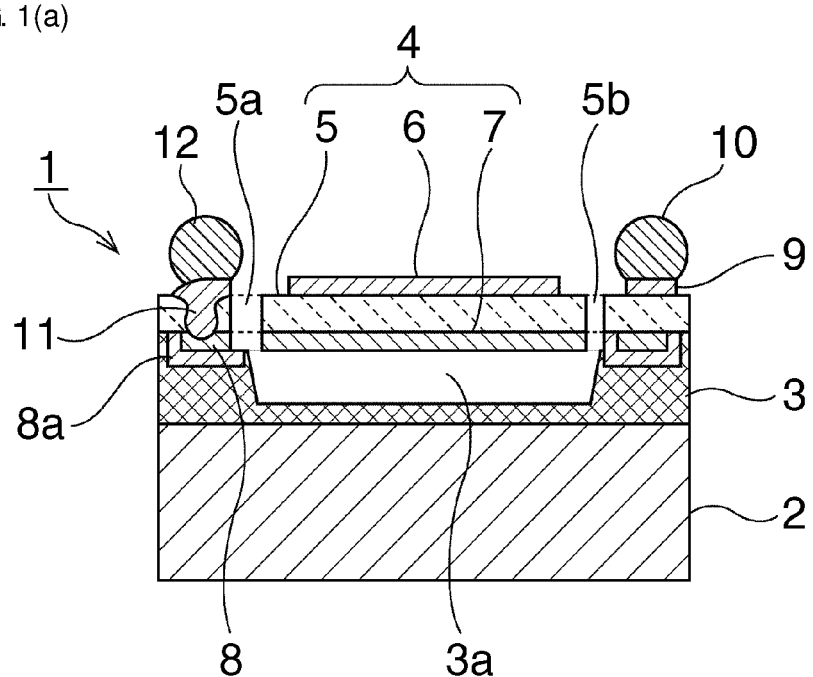
FIGS. 1(a) and 1(b) are an elevational cross-sectional view and a plan view, respectively, of a piezoelectric bulk wave device according to an embodiment of the present invention.
Figure 1B:
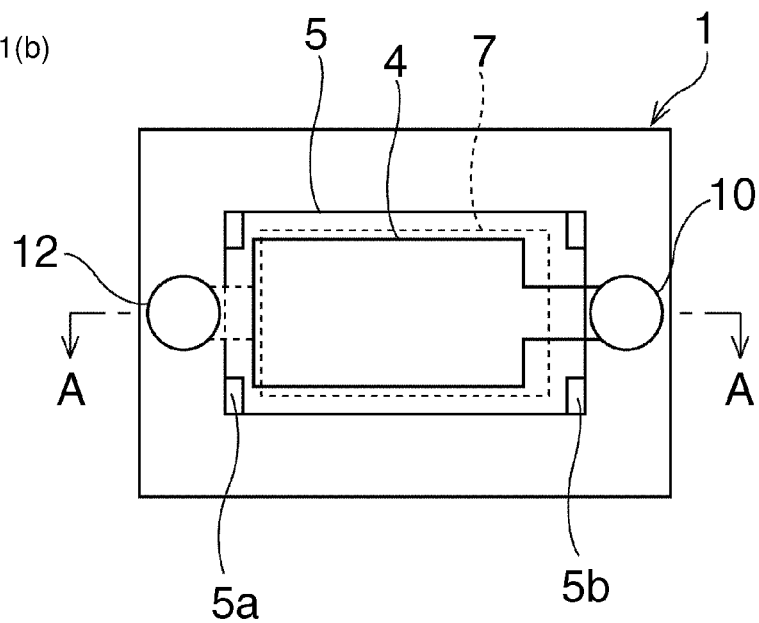

FIGS. 1(a) and 1(b) are a schematic elevational cross-sectional view and a plan view, respectively, of a piezoelectric bulk wave device according to an embodiment of the present invention.

A piezoelectric bulk wave device 1 according to this embodiment has a support substrate 2. The support substrate 2 is formed by a suitable insulating body or piezoelectric body. In this embodiment, the support substrate 2 is formed by alumina.

An insulating layer 3 is formed on the support substrate 2. While the insulating layer 3 is made of silicon oxide in this embodiment, the insulating layer 3 may be made of a suitable insulating material such as LiTaO$_3$, LiNbO$_3$, sapphire, or glass. Alumina, glass, and LiNbO$_3$ are preferred because these materials are inexpensive in comparison to LiTaO$_3$ and sapphire, and easy to manufacture. A recess 3a is formed on the upper surface of the insulating layer 3. A piezoelectric thin plate vibrating part 4 is disposed above the portion where the recess 3a is provided. The piezoelectric thin plate vibrating part 4 has a piezoelectric thin plate 5, a first electrode 6 formed on the upper surface of the piezoelectric thin plate 5, and a second electrode 7 formed on the lower surface of the piezoelectric thin plate 5.

The piezoelectric thin plate 5 is made of LiTaO$_3$. The piezoelectric thin plate 5 refers to a thin piezoelectric body with a thickness of not more than 2 μm. According to a manufacturing method described later, such a piezoelectric thin plate made of LiTaO$_3$ having a small thickness can be obtained with high accuracy by using an ion implantation-splitting method.

The piezoelectric thin plate 5 is a piezoelectric body having a small thickness of not more than about 2 μm as mentioned above. According to this embodiment, in a case where such as a piezoelectric thin plate made of LiTaO$_3$ and having a small thickness is used, even if variations occur in the thickness of the LiTaO$_3$, variations in electromechanical coupling coefficient $k^2$ can be reduced. This is because the first and second electrodes 6 and 7 are configured as described below according to this embodiment.

That is, according to a characteristic feature of the present invention, there is provided a piezoelectric bulk wave device that utilizes a bulk wave of the thickness shear mode of LiTaO$_3$, in which the first and second electrodes 6 and 7 are each formed by a conductor with a specific acoustic impedance higher than the specific acoustic impedance of a transversal wave that propagates in LiTaO$_3$, and when the sum of the thicknesses of the first and second electrodes 6 and 7 is defined as an electrode thickness, and the thickness of LiTaO$_3$ is defined as an LT thickness, the electrode thickness/(electrode thickness+LT thickness) is not less than 5% and not more than 40%. In this case, variations in electromechanical coupling efficient $k^2$ can be reduced. That is, because variations in electromechanical coupling efficient $k^2$ are small even in the presence of variations in electrode 6 and 7 thickness or LiTaO$_3$ thickness, fluctuations in fractional band width can be reduced.

Further, in a case where the electrode thickness/(electrode thickness+LT thickness) mentioned above is higher than or equal to 5%, the electromechanical coupling coefficient $k^2$ can be increased to be higher than or equal to 10%. These features will be described in more detail below with reference to FIGS. 2 to 10.

FIGS. 2 to 10 assume the following configuration.

A structure in which the first electrode 6 made of W is laminated on the upper surface of a piezoelectric thin plate made of LiTaO$_3$, and the second electrode 7 is laminated on the lower surface of the piezoelectric thin plate. It is supposed that the thickness of LiTaO$_3$, that is, the LT thickness, and the electrode thickness=(the thickness of the first electrode 6 and the thickness of the second electrode 7) are 1000 nm. That is, the electrode thickness=upper electrode thickness+lower electrode thickness. In this case, the electrode thickness/(electrode thickness+LT thickness) was varied within the range of 5% to 95%. It is supposed that the first electrode 6 and the second electrode 7 are opposed to a square-shaped region with an area of 44.7 μm×44.7 μm=2000 μm$^2$, and also, the Euler Angles of LiTaO$_3$ were set as (0°, 73°, 0°).

Figure 2:
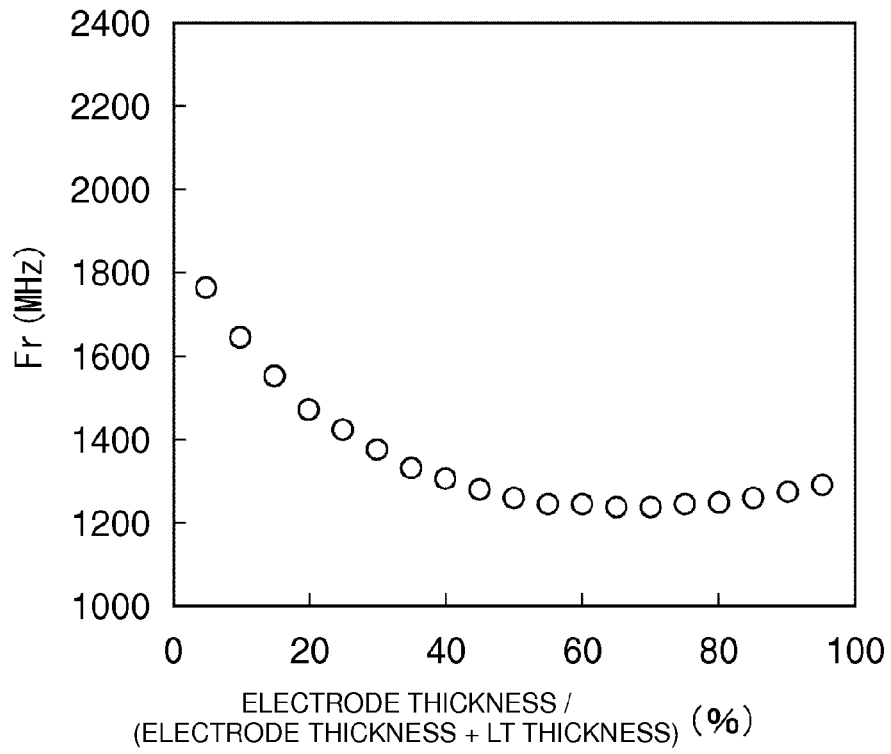
FIG. 2 illustrates the relationship between electrode thickness/(electrode thickness and LT thickness), the electrode thickness being the electrode thickness of first and second electrodes made of W, and resonant frequency, in accordance with an embodiment of the present invention.
Figure 3:
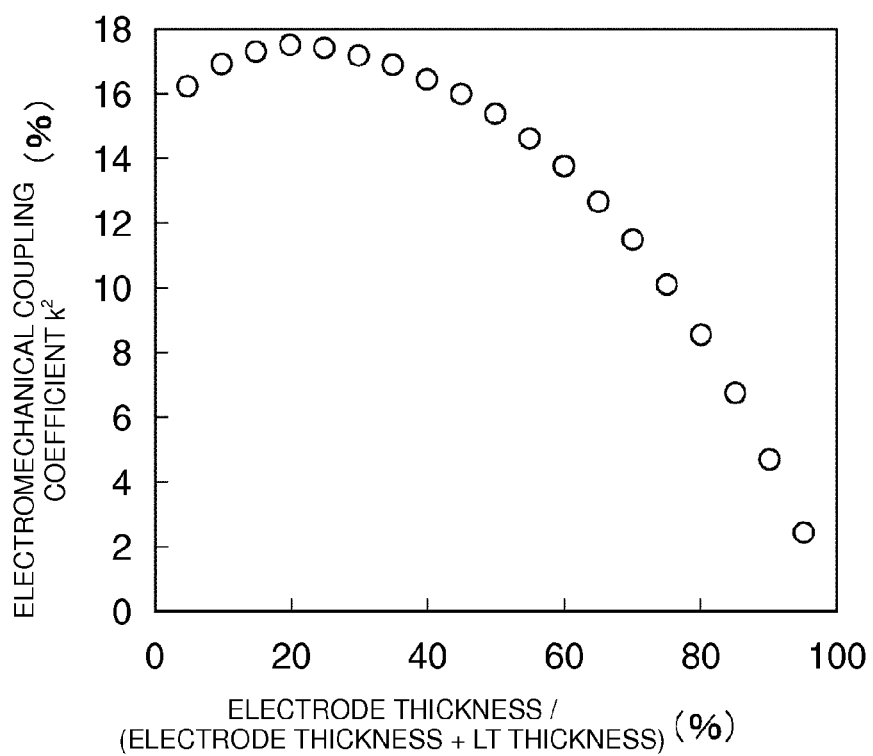
FIG. 3 illustrates the relationship between electrode thickness/(electrode thickness and LT thickness), the electrode thickness being the electrode thickness of the first and second electrodes made of W, and electromechanical coupling coefficient k$^2$, in accordance with an embodiment of the present invention.
Figure 4:
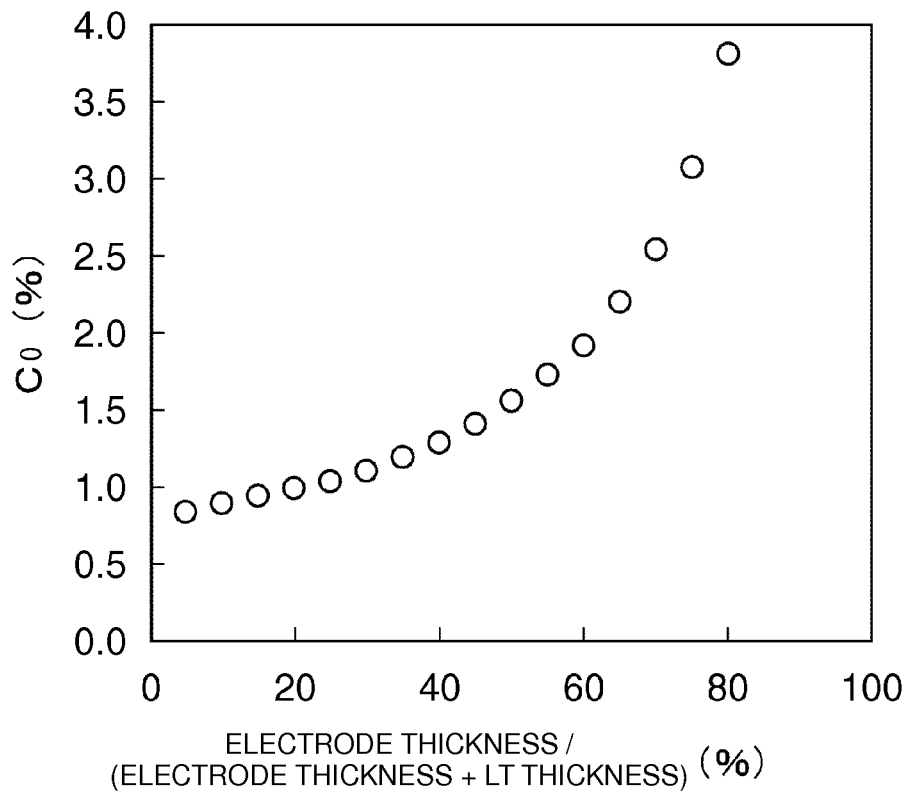
FIG. 4 illustrates the relationship between electrode thickness/(electrode thickness and LT thickness), the electrode thickness being the electrode thickness of the first and second electrodes made of W, and damping capacitance C$_0$, in accordance with an embodiment of the present invention.

FIG. 2 illustrates the relationship between the electrode thickness/(electrode thickness+LT thickness) mentioned above, and resonant frequency. FIG. 3 illustrates the relationship between the electrode thickness/(electrode thickness+LT thickness) mentioned above, and electromechanical coupling coefficient $k^2$. FIG. 4 illustrates the relationship between the electrode thickness/(electrode thickness+LT thickness) mentioned above, and damping capacitance $C_0$.

It is apparent from FIG. 3 that when the electrode thickness/(electrode thickness+LT thickness) is in the range of not less than 5% and not more than 40%, variations in electromechanical coupling coefficient $k_2$ are small. The electromechanical coupling coefficient $k_2$ is proportional to the band width of a filter. Therefore, because variations in electromechanical coupling coefficient $k_2$ are small, if the electrode thickness/(electrode thickness+LT thickness) is within the range of not less than 5% and not more than 40%, variations in band width can be effectively reduced. Therefore, it is possible to provide a piezoelectric bulk wave device with relatively small variations in frequency.

The thickness of a piezoelectric thin plate is proportional to the acceleration voltage of an ion beam. Generally, an ion implantation device has a tradeoff relationship between the beam current and acceleration voltage of an ion beam. This is due to the following reason. That is, as the electric power value expressed as the product of beam current and acceleration voltage is increased, the amount of energy applied to the substrate per unit time increases, leading to problems such as breakage of the substrate due to thermal stress caused by local heat generation. When the acceleration voltage is increased, the depth of ion implantation can be increased, and thus the piezoelectric thin plate can be made thicker. However, because the beam current becomes smaller, it takes longer to implant ions to a concentration that allows separation of the piezoelectric thin plate (for example, $8 \times 10^{16}$ ions/cm$^2$). Therefore, in order to increase production efficiency per unit time, it is necessary to increase beam current, and it is desirable to decrease acceleration voltage. In order to decrease acceleration voltage, it is necessary to reduce the thickness of the piezoelectric thin plate to obtain required frequency characteristics. Although the resonant frequency of a piezoelectric bulk wave device tends to become higher as the piezoelectric thin plate becomes thinner, the present invention proves advantageous in this regard because a piezoelectric bulk wave device for use in a frequency band lower than 1.5 GHz, in particular, can be realized by means of a piezoelectric thin plate with a small thickness of about 1 μm.

In a case where the electrode thickness/(electrode thickness+LT thickness) is higher than or equal to 5%, the absolute value of the electromechanical coupling coefficient $k^2$ can be also made higher than 10%. Therefore, it is appreciated that a filter that covers a wide frequency band can be provided.

Incidentally, bulk wave resonators according to related art use AlN as a piezoelectric body. While the relative dielectric constant of AlN is about 12, the relative dielectric constant of LiTaO$_3$ is 40.9 to 42.5, and thus about 3.4 times greater. Moreover, the acoustic velocity of the transversal wave of a bulk wave is low, at 0.68 times in the case of LiTaO$_3$ in comparison to AlN. Therefore, in the case of the same frequency, the same ratio of the electrode thickness/(electrode thickness+LT thickness), and the same impedance, the area of a bulk wave resonator using LiTaO$_3$ can be reduced to about one-fifth of the area of a bulk wave resonator using AlN. Therefore, miniaturization of the piezoelectric bulk wave device can be achieved.

Figure 5:
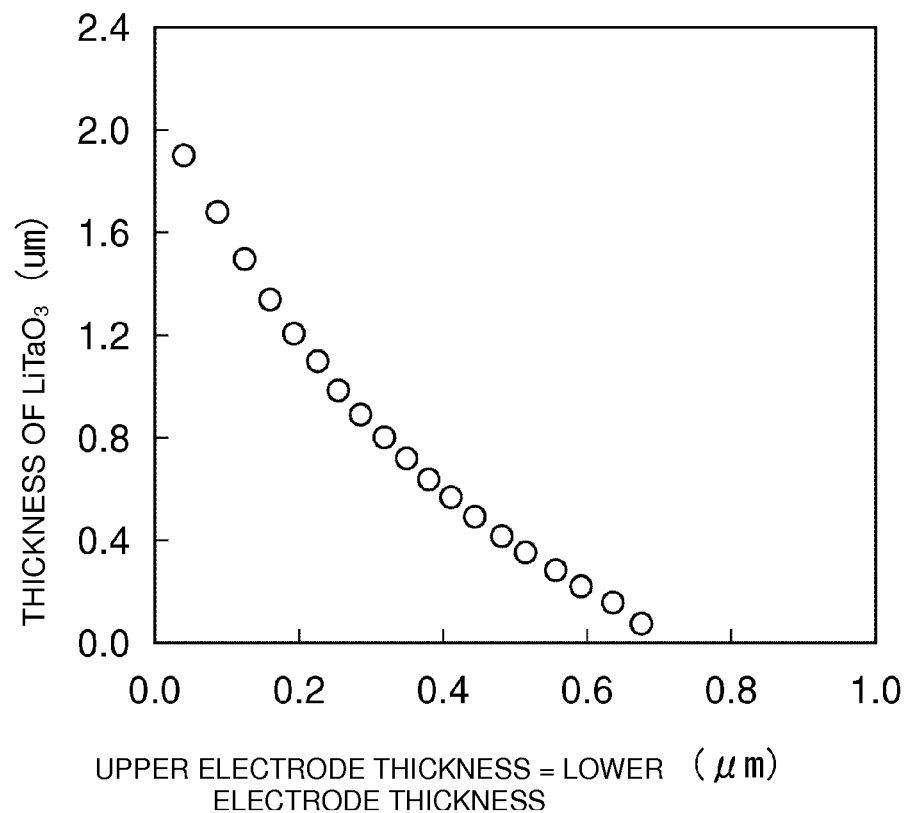
FIG. 5 illustrates the relationship between upper electrode thickness=lower electrode thickness, and the thickness of LiTaO$_3$, in a case where the first and second electrodes are made of W and the resonant frequency is 880 MHz in accordance with an embodiment of the present invention.
Figure 6:
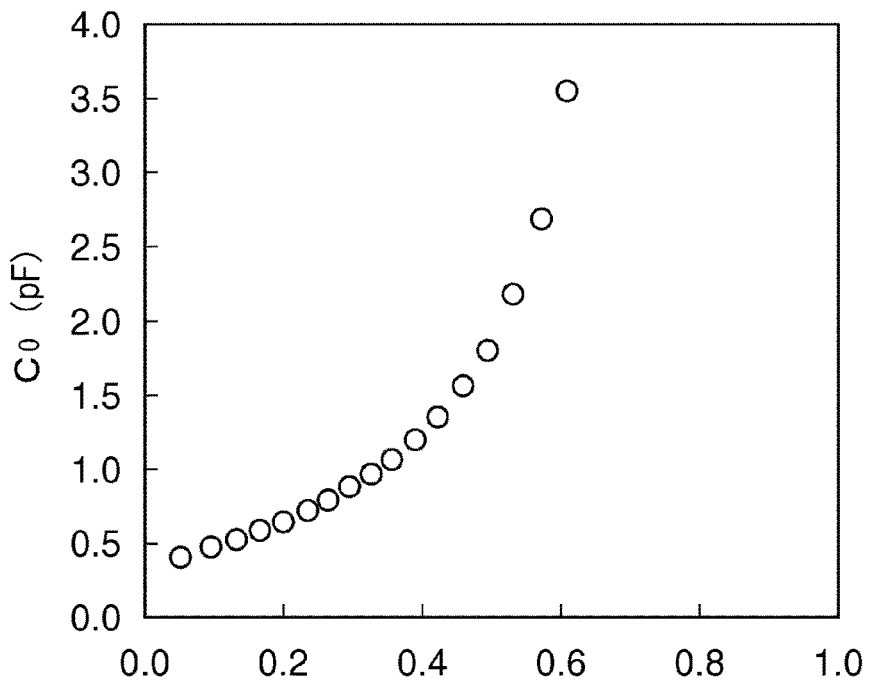
FIG. 6 illustrates the relationship between upper electrode thickness=lower electrode thickness, and damping capacitance C$_0$, in a case where the first and second electrodes are made of W and the resonant frequency is 880 MHz in accordance with an embodiment of the present invention.
Figure 7:
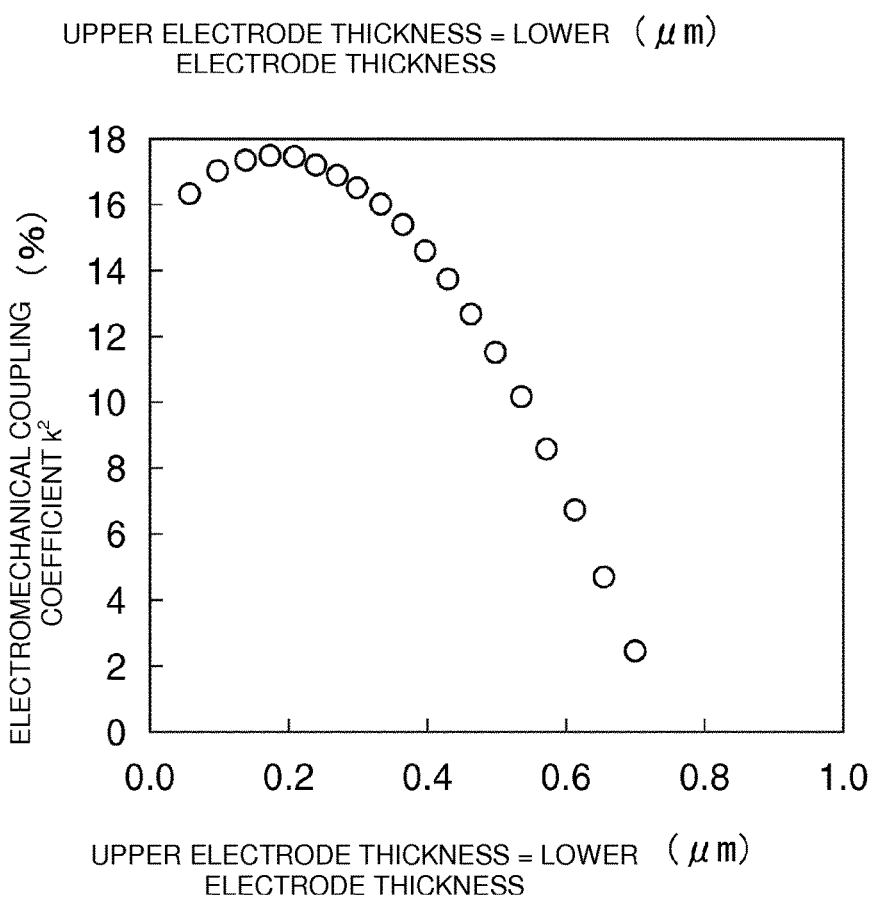
FIG. 7 illustrates the relationship between upper electrode thickness=lower electrode thickness, and electromechanical coupling coefficient k$^2$, in a case where the first and second electrodes are made of W and the resonant frequency is 880 MHz in accordance with an embodiment of the present invention.

FIG. 5 illustrates the relationship between upper electrode thickness=lower electrode thickness, and the thickness of LiTaO$_3$, in a case where the above-mentioned laminated structure is configured so that the resonator is set to a frequency of 880 MHz. FIG. 6 illustrates the relationship between upper electrode thickness=lower electrode thickness, and damping capacitance $C_0$. FIG. 7 illustrates the relationship between upper electrode thickness=lower electrode thickness, and electromechanical coupling coefficient $k^2$. It is to be noted that the upper electrode thickness=lower electrode thickness indicates that the first electrode 6 and the second electrode 7 are equal in thickness, and FIGS. 5 to 7 each illustrate the relationship between the thickness of one of these electrodes, and the thickness of LiTaO$_3$, damping capacitance $C_0$, or electromechanical coupling coefficient $k^2$.

Figure 8:
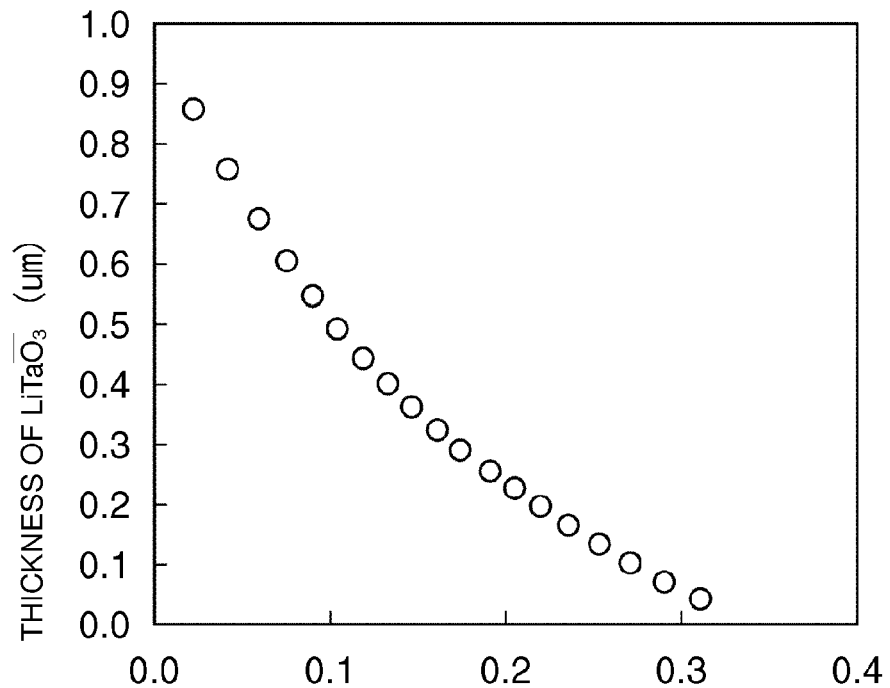
FIG. 8 illustrates the relationship between upper electrode thickness=lower electrode thickness, and the thickness of LiTaO$_3$, in a case where the first and second electrodes are made of W and the resonant frequency is 1960 MHz in accordance with an embodiment of the present invention.
Figure 9:
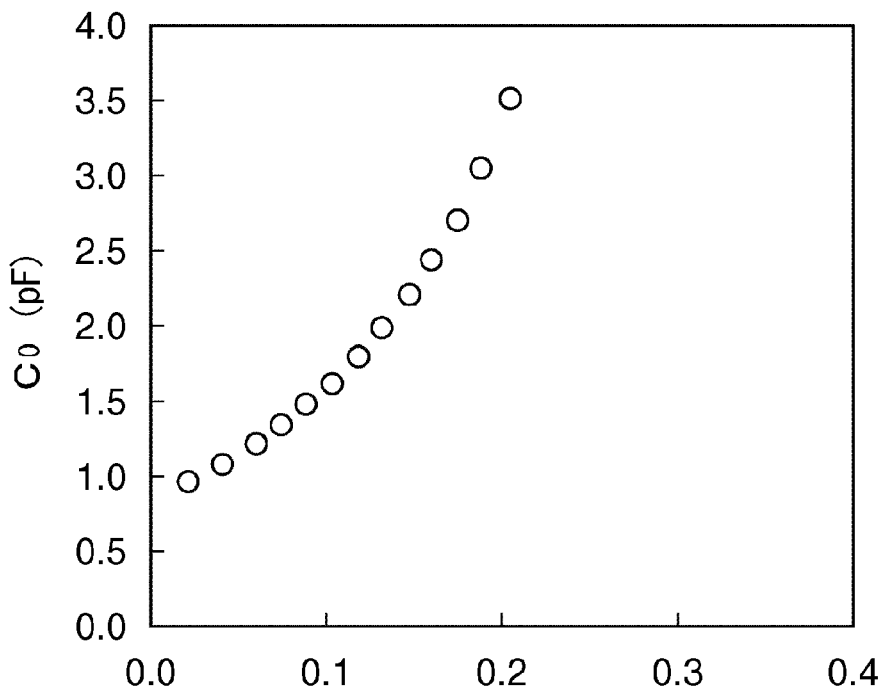
FIG. 9 illustrates the relationship between upper electrode thickness=lower electrode thickness, and damping capacitance C$_0$, in a case where the first and second electrodes are made of W and the resonant frequency is 1960 MHz in accordance with an embodiment of the present invention.
Figure 10:
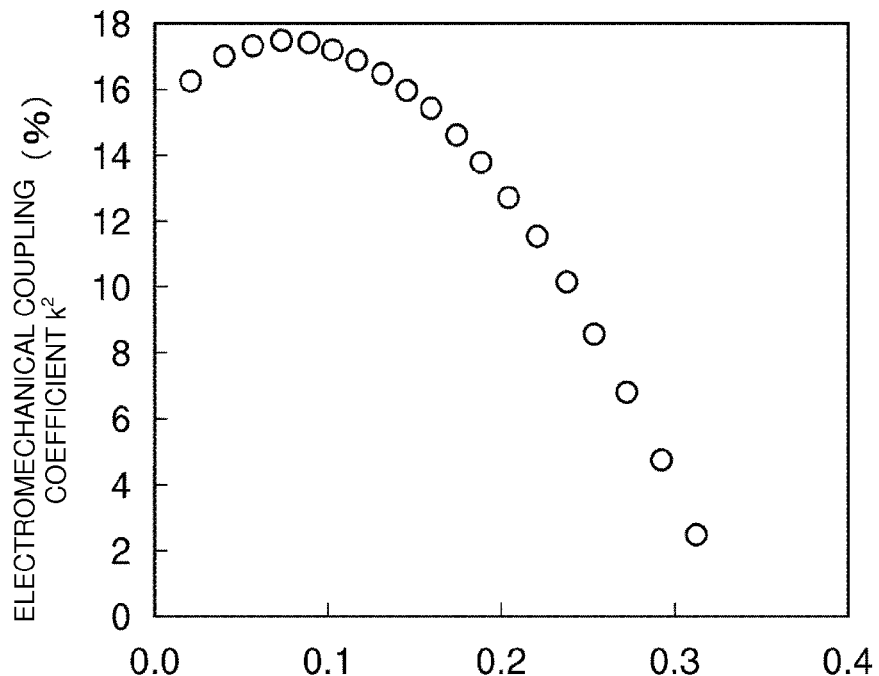
FIG. 10 illustrates the relationship between upper electrode thickness=lower electrode thickness, and electromechanical coupling coefficient k$^2$, in a case where the first and second electrodes are made of W and the resonant frequency is 1960 MHz in accordance with an embodiment of the present invention.

FIG. 8 illustrates the relationship between upper electrode thickness=lower electrode thickness and the thickness of LiTaO$_3$ in a case where the resonator is set to 1960 MHz. FIG. 9 illustrates the relationship between upper electrode thickness=lower electrode thickness, and damping capacitance $C_0$. FIG. 10 illustrates the relationship between upper electrode thickness=lower electrode thickness, and electromechanical coupling coefficient $k^2$.

As can be appreciated from a comparison between FIGS. 5 to 7 and FIGS. 8 to 10, irrespective of whether the resonator is set to 880 MHz or 1960 MHz, the upper electrode thickness=lower electrode thickness, and the thickness of LiTaO$_3$, the magnitude of damping coefficient $C_0$, and the electromechanical coupling coefficient $k^2$ tend to change in a similar manner.

Figure 11:
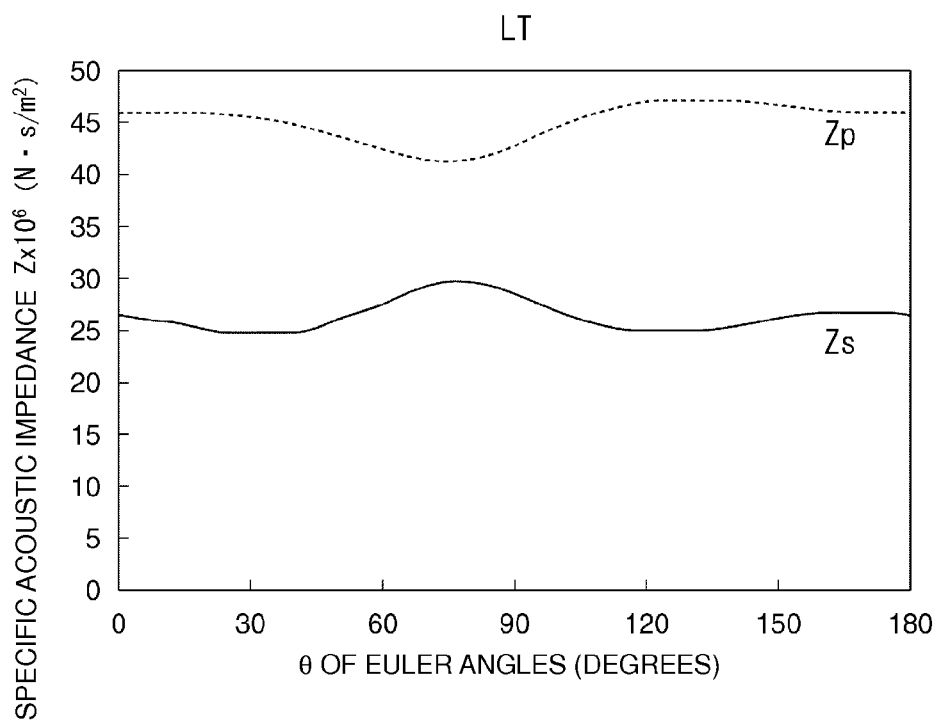
FIG. 11 illustrates the relationship between the Euler Angles θ of LiTaO$_3$ and specific acoustic impedance.

While the Euler Angles of LiTaO$_3$ were set as (0°, 73°, 0°) in FIGS. 2 to 10, the same effect was obtained also in the case of Euler Angles of (90°, 90°, 0°). That is, it is appreciated that the same effect is obtained also in the case of a crystal orientation in which the c-axis of LiTaO$_3$ is in close proximity to the plane direction. As has been described above, this embodiment can provide a resonator or filter that exhibits relatively small fluctuations in band width and also covers a wide frequency band. This is due to the fact that because the specific acoustic impedance of W is high in comparison to the specific acoustic impedance of a transversal wave that propagates in LiTaO$_3$, the reflection coefficient as seen from LiTaO$_3$ becomes positive. It is to be noted that as illustrated in FIG. 11, the specific acoustic impedance of a transversal wave that propagates in LiTaO$_3$ does not vary very much with a change in θ of the Euler Angles, and ranges between 24.8 kg·s/m$^2$ to 29.7 kg·s/m$^2$. The specific acoustic impedance for W is 50.5 kg·s/m$^2$.

While the first and second electrodes 6 and 7 are formed of W in the above-mentioned embodiment, the metal used is not limited to W, but a metal such as Mo, Pt, or Ta with a high specific acoustic impedance in comparison to the specific acoustic impedance of a transversal wave that propagates in LiTaO$_3$ may be used. Alternatively, an alloy mainly including the metal may be used.

The first and second electrodes 6 and 7 may be each formed by a laminated metal film including a plurality of metal films laminated.

The method of forming the first and second electrodes 6 and 7 is not particularly limited. A suitable method such as electron-beam evaporation, chemical vapor deposition, sputtering, or CVD may be used.

FIG. 1(a) corresponds to the cross-section of the portion taken along the line A-A in FIG. 1(b). The piezoelectric thin plate 5 has slits 5a and 5b on opposite sides of a direction along the line A-A of the recess 3a. Accordingly, as illustrated in FIG. 1(a), the piezoelectric thin plate vibrating part 4 is made afloat above the recess 3a. On the outer side portion of the slit 5a, a line electrode 8 is formed on the insulating layer 3. The line electrode 8 is connected to the second electrode 7 in a portion not illustrated in the drawing. In addition, a line electrode 9 is formed on the outer side portion of the slit 5b. The line electrode 9 is formed on the piezoelectric thin plate 5, and is electrically connected to the first electrode 6 in a portion not illustrated in the drawing. The line electrodes 8 and 9 are each made of a suitable conductive material. As such a conductive material, Cu, Al, an alloy of these materials, or the like may be used.

A gold bump 10 is provided on the line electrode 9. In addition, a via-hole electrode 11 is provided in the piezoelectric thin plate 5 so as to be electrically connected to the line electrode 8. A gold bump 12 is joined to the upper end of the via-hole electrode 11. Accordingly, the piezoelectric thin plate vibrating part 4 can be vibrated by application of an alternating electric field from each of the gold bumps 10 and 12. In addition, because the line electrode 8 that transmits a principal electric signal is spaced apart from the joint interface between the insulating layer 3 and the support substrate 2, the line electrode 8 is able to transmit the principal electric signal with low loss, without being subject to the influence of semiconductor-like resistance degradation due to diffusion or non-uniformity at the joint interface or the skin effect.

In the piezoelectric bulk wave device 1 according to this embodiment, the thickness shear vibration mode of the piezoelectric thin plate 5 made of LiTaO$_3$ is utilized for the piezoelectric thin plate vibrating part 4. Preferably, of the Euler Angles ($\phi$, $\theta$, $\phi$) of LiTaO$_3$, $\phi$ is 0°, and $\theta$ is in the range of not less than 54° and not more than 107°. As a result, good resonance characteristics utilizing thickness shear vibration mode can be obtained. This will be described in more detail below.

By the finite element method, a bulk wave oscillator that utilizes thickness shear vibration mode and thickness longitudinal vibration mode using LiTaO$_3$ was analyzed. The thickness of LiTaO$_3$ was set to 1000 nm. A structure in which electrodes having a thickness of 100 nm and made of Al are formed on the top and the bottom of this LiTaO$_3$ was used as a model. The area over which the upper and lower electrodes overlap was set to 2000 μm$^2$.

Of the Euler Angles (0°, $\theta$, 0°) of LiTaO$_3$, $\theta$ was varied, and the states of the thickness shear vibration mode and thickness longitudinal vibration mode were analyzed. The results are illustrated in FIGS. 12 to 18.

Figure 12:
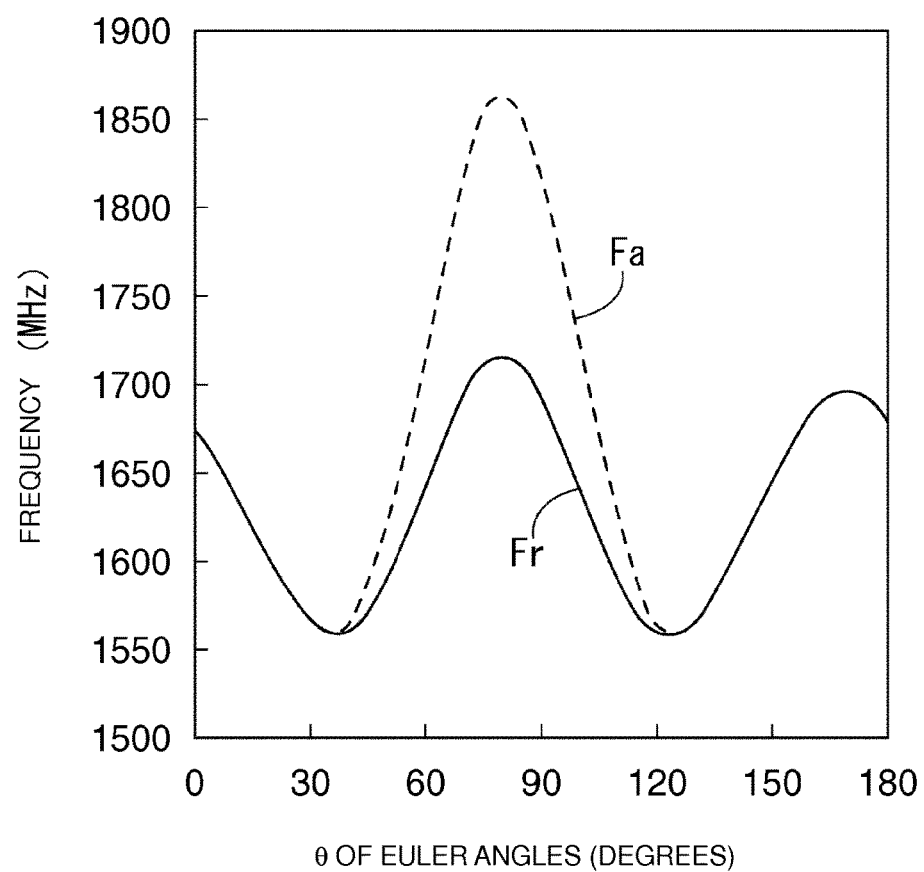
FIG. 12 illustrates the relationship between the Euler Angles θ of LiTaO$_3$, and the resonant frequency Fr and anti-resonant frequency Fa of thickness shear mode.
Figure 13:
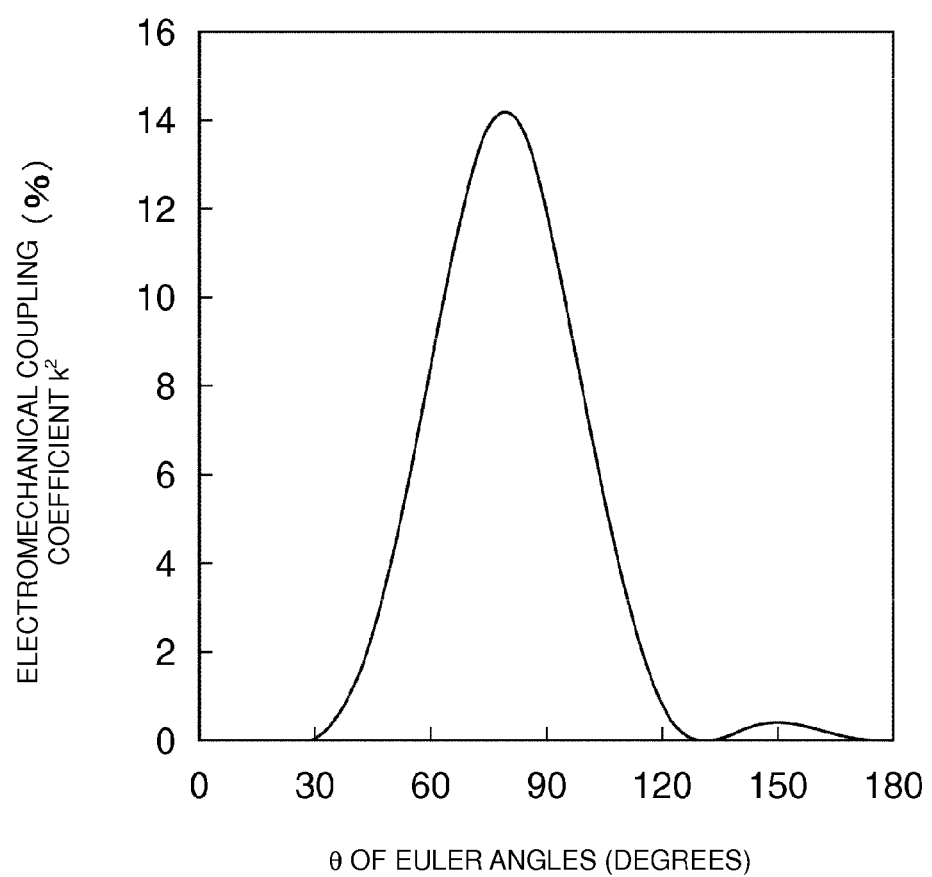
FIG. 13 illustrates the relationship between the Euler Angles θ of LiTaO$_3$, and the electromechanical coupling coefficient k$^2$ of thickness shear mode.

FIG. 12 illustrates the relationship between $\theta$ of the Euler Angles, and the resonant frequency Fr and anti-resonant frequency Fa of the thickness shear vibration mode. In FIG. 12, the solid line indicates resonant frequency, and the broken line indicates anti-resonant frequency. FIG. 13 illustrates the relationship between $\theta$ of the Euler Angles, and the electromechanical coupling coefficient k$^2$ of the thickness shear vibration mode. As is apparent from FIG. 13, the electromechanical coupling coefficient k$^2$ of the thickness shear vibration mode used takes the maximum value of 14.3% when $\theta$ is in the vicinity of 80°. In this regard, when $\theta$ is in the range of not less than 54° and not more than 107°, the resulting electromechanical coupling coefficient k$^2$ exceeds 5%, thus providing an electromechanical coupling coefficient required for producing the band width of a filter for portable terminal applications. Further, when $\theta$ is in the range of not less than 63° and not more than 97°, the resulting electromechanical coupling coefficient k$^2$ still keeps a large value of 9.5% or more, which is two-thirds of the above-mentioned maximum value. The electromechanical coupling coefficient k$^2$ is proportional to the band width of a filter. Accordingly, it is appreciated that by setting $\theta$ of the Euler Angles to be not less than 54° and not more than 107°, the electromechanical coupling coefficient k$^2$ can be increased, and a bulk wave filter that covers a wide frequency band can be provided.

Therefore, it is appreciated that according to this embodiment, a bulk wave device that covers a wide frequency band can be provided by setting $\theta$ of the Euler Angles to be not less than 54° and not more than 107°. That said, depending on the intended application, it is not always desirable to make the band width as large as possible. However, the band width can be narrowed by adding an electrostatic capacity in parallel to or in series with a bulk wave resonator. Accordingly, in a case where the electromechanical coupling coefficient k$^2$ is large, the freedom of design can be increased. Therefore, because $\theta$ of the Euler Angles is not less than 54° and not more than 107°, and the electromechanical coupling coefficient k$^2$ is large, bulk wave devices for various band widths can be easily provided.

Figure 15:
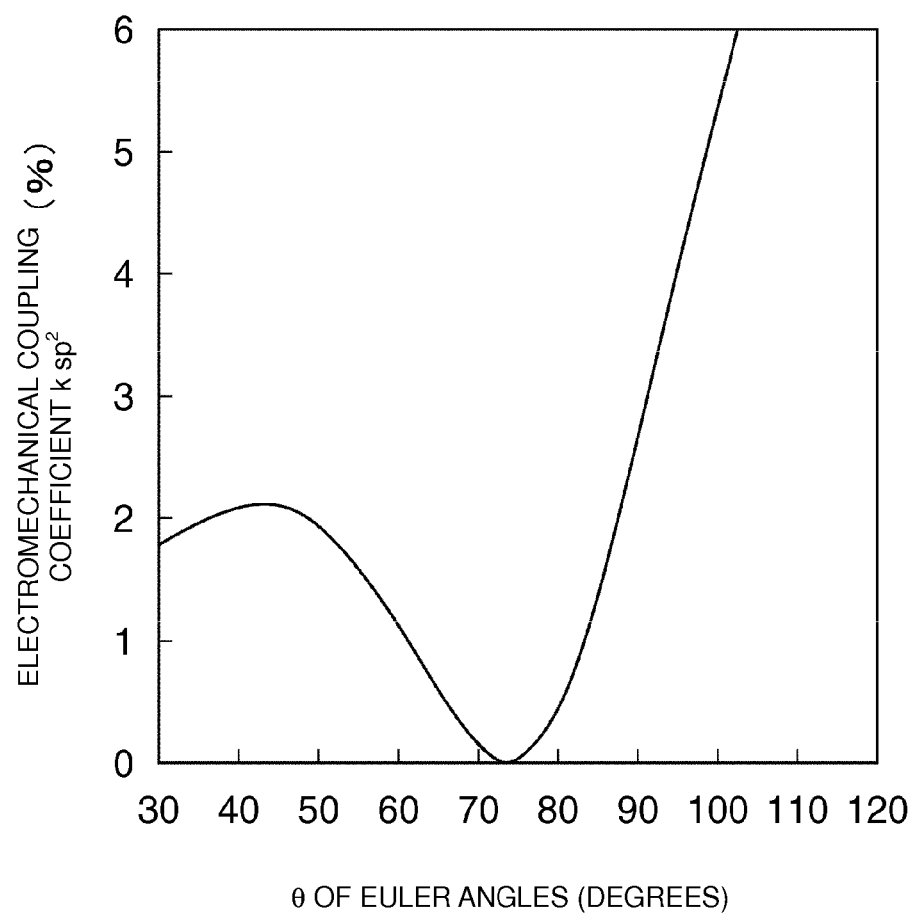
FIG. 15 illustrates the relationship between the Euler Angles θ of LiTaO$_3$, and the electromechanical coupling coefficient ksp$^2$ of thickness longitudinal vibration mode that is spurious.
Figure 16:
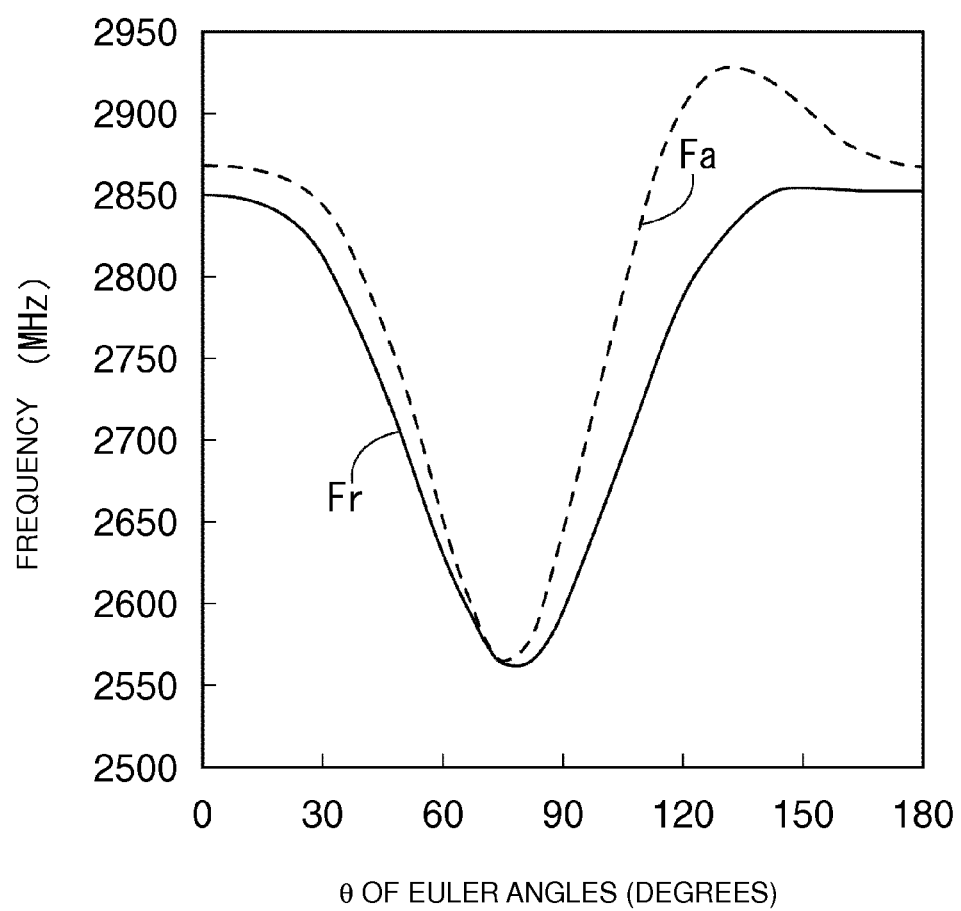
FIG. 16 illustrates the relationship between the Euler Angles θ of LiTaO$_3$, and the resonant frequency Fr and anti-resonant frequency Fa of thickness longitudinal vibration.
Figure 17:
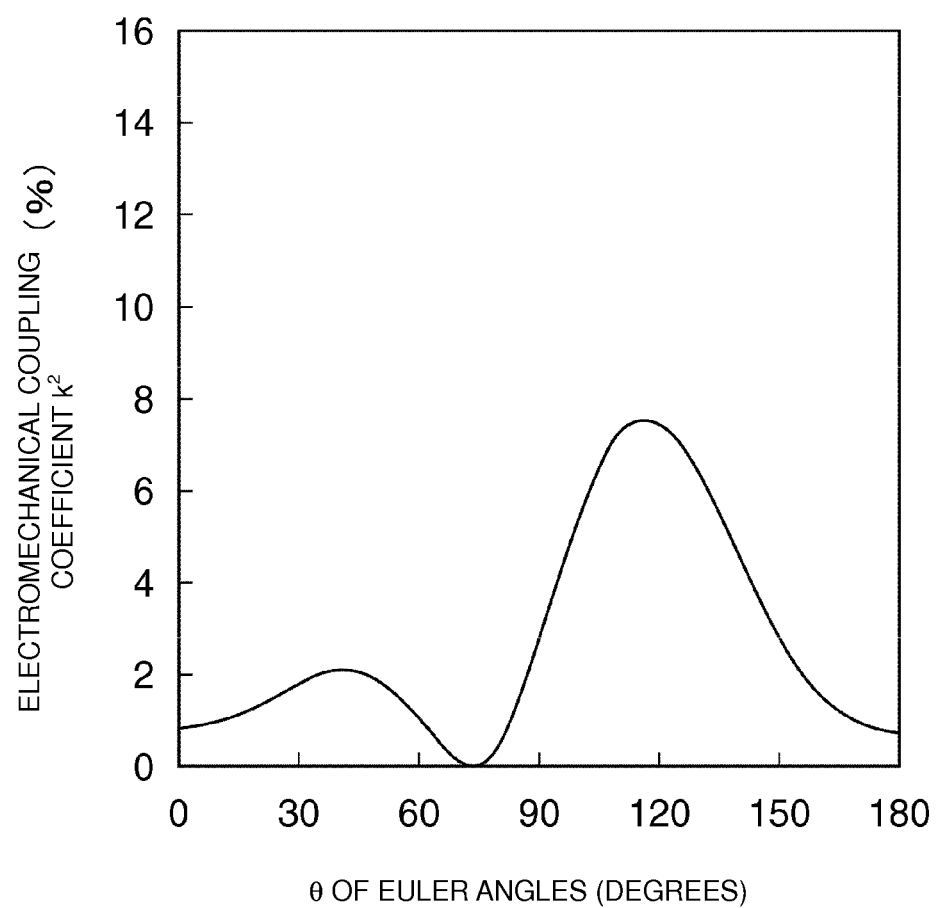
FIG. 17 illustrates the relationship between the Euler Angles θ of LiTaO$_3$, and the electromechanical coupling coefficient k$^2$ of thickness longitudinal vibration.
Figure 18:
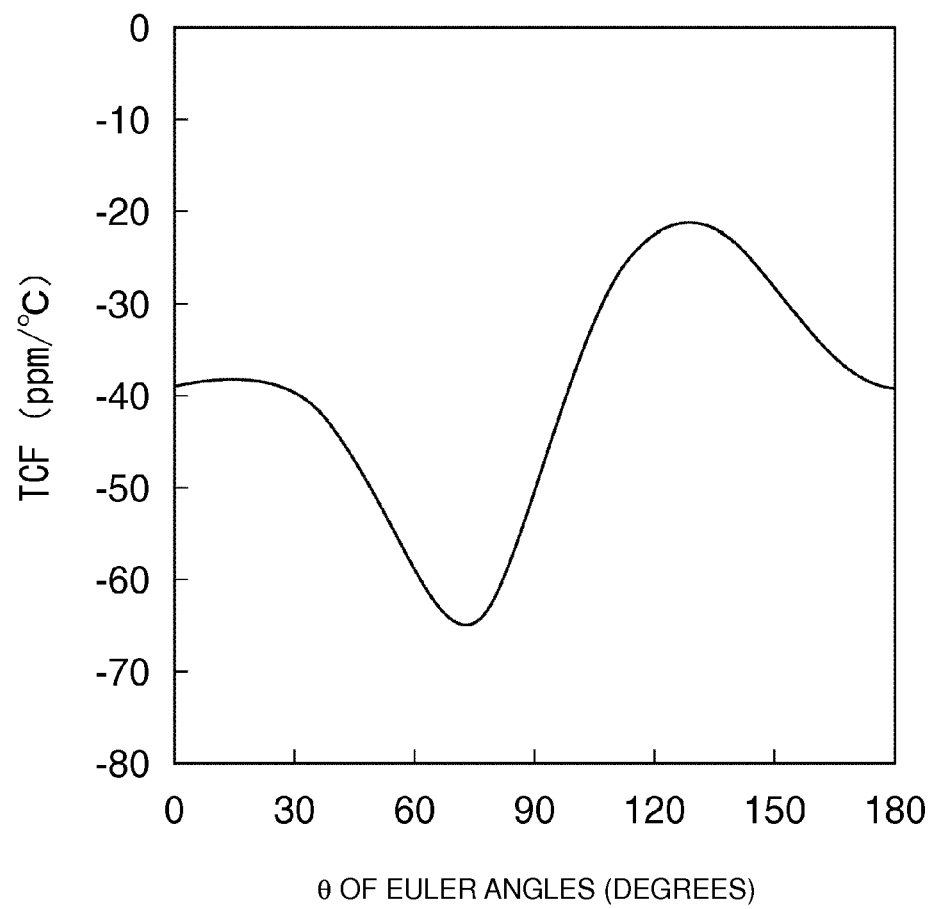
FIG. 18 illustrates the relationship between the Euler Angles θ of LiTaO$_3$, and temperature coefficient of frequency TCF.

As is apparent from FIG. 15, the electromechanical coupling coefficient k$^2$ of the thickness longitudinal vibration mode that is spurious becomes substantially zero when $\theta$ is 73°. This also agrees with the results illustrated in FIG. 17. That is, FIGS. 16 to 18 explain variation of the thickness longitudinal vibration mode that is spurious due to $\theta$ of the Euler Angles. FIG. 16 illustrates the relationship between $\theta$ of the Euler Angles, and the resonant frequency Fr and anti-resonant frequency Fa of thickness longitudinal vibration. In FIG. 16, the solid line indicates the results on resonant frequency, and the broken line indicates the results on anti-resonant frequency. FIG. 17 illustrates the relationship between $\theta$ of the Euler Angles and the electromechanical coupling coefficient k$^2$ of thickness longitudinal vibration. FIG. 18 illustrates the relationship between $\theta$ of the Euler Angles and temperature coefficient of frequency TCF. As is also apparent from FIGS. 16 to 18, when $\theta$ of the Euler Angles is 73°, the electromechanical coupling coefficient k$^2$ of the thickness longitudinal vibration mode that is spurious becomes substantially zero, and when $\theta$ is in the range of not less than 55° and not more than 85°, as is apparent from FIG. 15, the electromechanical coupling coefficient k$^2$ of the thickness longitudinal vibration mode that is spurious has a very small value of 1.5% or less.

Therefore, more preferably, it is desirable to set $\theta$ of the Euler Angles to be in the range of not less than 55° and not more than 85°. As a result, the response of the thickness longitudinal vibration mode that is spurious can be made small. Therefore, in a case where a piezoelectric bulk wave device is configured in accordance with the above-mentioned embodiment, the attenuation characteristics in the stop band of the filter can be improved.

Figure 14:
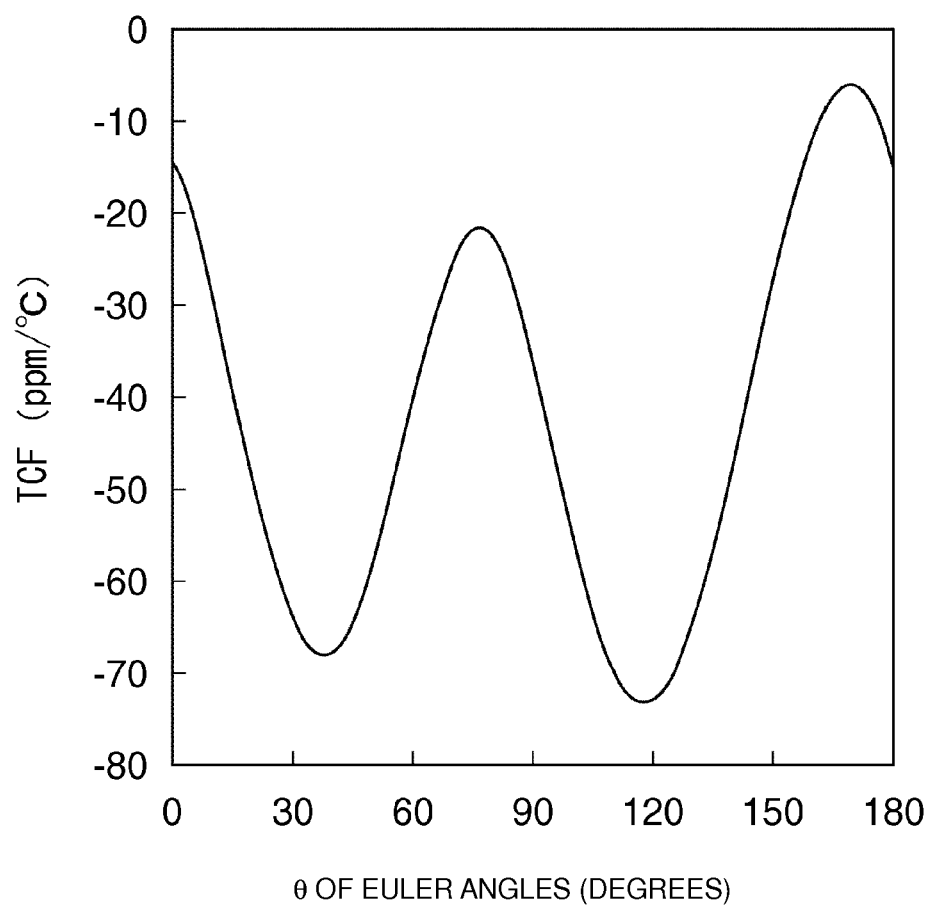
FIG. 14 illustrates the relationship between the Euler Angles θ of LiTaO$_3$, and the temperature coefficient of frequency TCF of thickness shear mode.

As is apparent from FIG. 14, the temperature coefficient of frequency TCF of the thickness shear vibration mode is small at 21.4 ppm/° C. when $\theta$=75°. Further, when $\theta$ is in the range of not less than 62° and not more than 87°, the TCF is small at 30 ppm/° C. or less. Therefore, further preferably, it is desirable to set $\theta$ to be within the range of not less than 62° and not more than 87°. As a result, the passband or stopband of the filter in the piezoelectric bulk wave device 1 is unlikely to shift with a change in environmental temperature. That is, it is possible to provide the piezoelectric bulk wave device 1 that is stable against fluctuations in frequency.

Figure 19:
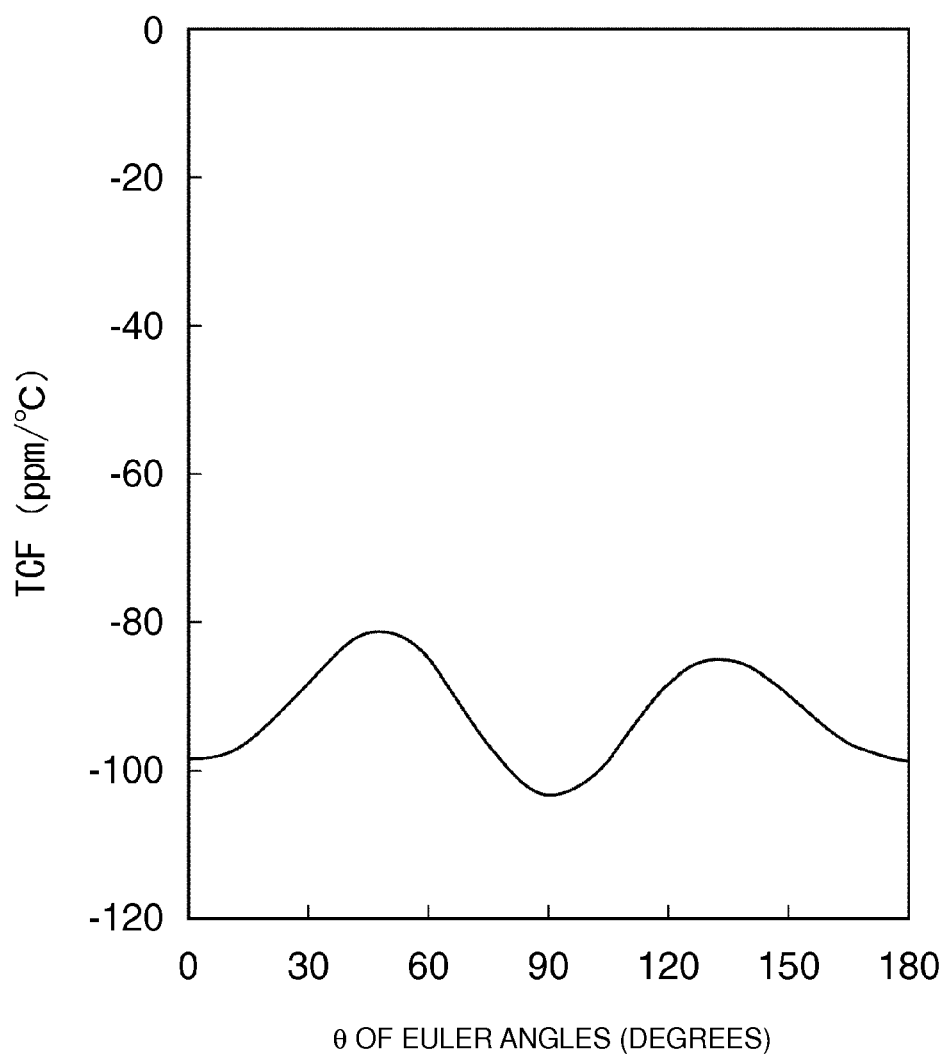
FIG. 19 illustrates the relationship between Euler Angles θ and temperature coefficient of frequency TCF in thickness shear vibration mode, in a case where LiNbO$_3$ is used.

FIG. 19 illustrates the relationship between the Euler Angle $\theta$ and temperature coefficient of frequency TCF in the thickness shear vibration mode in a case where LiNbO$_3$ is used. For LiNbO$_3$, as in the case of LiTaO$_3$, the TCF in the vicinity of $\theta$=73° at which the electrochemical coupling coefficient k$^2$ of the thickness longitudinal vibration mode that is spurious becomes small is checked, and the result indicates that the TCF is 96 ppm/C.°, which is nearly five times as large as the TCF of 21.4 ppm/C.° in the case of LiTaO$_3$. Therefore, it can be said that it is preferable to use LiTaO$_3$ as a piezoelectric thin plate.

In FIGS. 12 to 18, a structure in which electrodes made of Al are formed on the upper and lower surfaces of LiTaO$_3$ was examined as a model. However, it has been confirmed that even if the electrode material is changed to another metal, although the absolute value of the electromechanical coupling coefficient k$^2$ may change, setting $\theta$ of the Euler Angles within the same range as mentioned above can increase the electromechanical coupling coefficient k$^2$, and further, setting $\theta$ within the above-mentioned desirable range can reduce spurious, or can make the absolute value of TCF smaller.

Next, an example of a method of manufacturing the piezoelectric bulk wave device 1 will be described with reference to FIGS. 20(a) to 23(c).

Figure 20A:
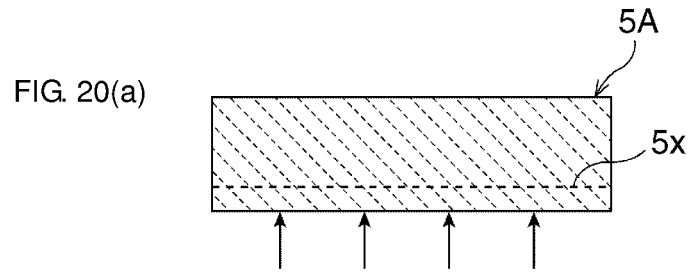
FIGS. 20(a) to 20(d) are schematic elevational cross-sectional views for explaining a method of manufacturing a piezoelectric bulk wave device according to an embodiment of the present invention.

As illustrated in FIG. 20(a), a piezoelectric substrate 5A made of LiTaO$_3$ is prepared. Hydrogen ions are implanted as indicated by arrows from one side of the piezoelectric substrate 5A. Ions to be implanted are not limited to hydrogen but helium or the like may be used. Although the energy at which ions are implanted is not particularly limited, this embodiment adopts the following conditions: a dose of 8×10$^{17}$ atoms/cm at 150 KeV. The above-mentioned ion implantation conditions may be selected in accordance with the target thickness of the piezoelectric thin plate. That is, the position of the high concentration ion-implanted portion can be controlled by selecting the above-mentioned ion implantation conditions.

Upon implanting ions, an ion concentration distribution occurs in the thickness direction within the piezoelectric substrate 5A. The portion of the highest ion concentration is indicated by a broken line in FIG. 20(a). In a high concentration ion-implanted portion 5x representing the portion of the highest ion concentration indicated by the broken line, the piezoelectric substrate 5A can be easily separated owing to stress when heated. This method of separation using the high concentration ion-implanted portion 5x is disclosed in Japanese Unexamined Patent Application Publication (Translation of PCT Application) No. 2002-534886.

Figure 20B:
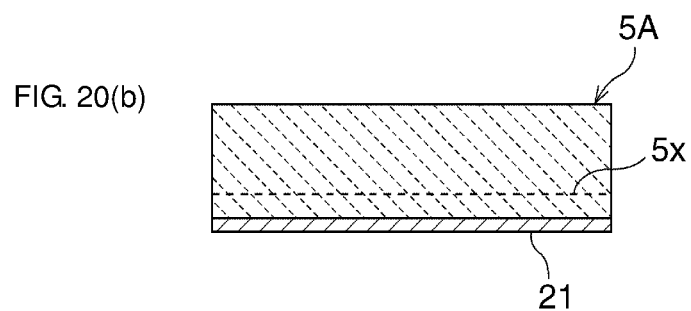

Next, as illustrated in FIG. 20(b), a temporary joining layer 21 is formed on the side of the piezoelectric substrate 5A from which ions have been implanted. The temporary joining layer 21 is provided for the purpose of joining a temporary support member 22 described later, and also protecting the piezoelectric thin plate 5 that is finally obtained. The temporary joining layer 21 is made of a material that is removed by an etching step described later. That is, the temporary joining layer 21 is made of a suitable material that is removed by etching, and does not damage the piezoelectric thin plate 5 at the time of etching. As such a material for forming the temporary joining layer 21, a suitable material such as an inorganic material or an organic material may be used. As the inorganic material, an insulating inorganic material such as ZnO, SiO$_2$, or AlN, or a metal material such as Cu, Al, or Ti may be given as an example, and as the organic material, a material such as polyimide may be given as an example. The temporary joining layer 21 may be a laminate of a plurality of films made of such a material. In this embodiment, the temporary joining layer 21 is made of SiO$_2$.

Figure 20C:
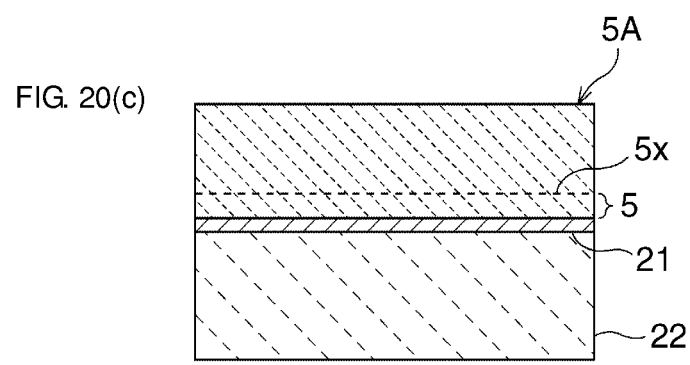
Figure 20D:
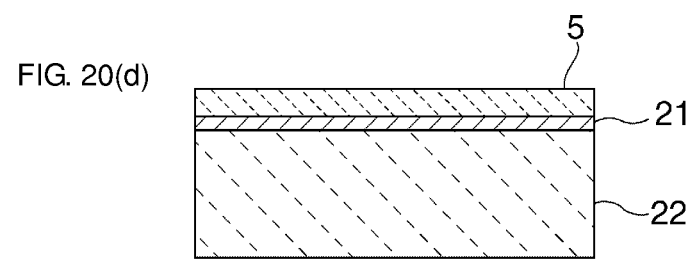

The temporary support member 22 is laminated and bonded onto the temporary joining layer 21 as illustrated in FIG. 20(c). The temporary support member 22 may be made of a suitable rigid material. As such a material, a suitable material such as insulating ceramic or piezoelectric ceramic may be used. In this regard, the temporary support member is made of such a material that hardly any thermal stress is exerted at the interface with the piezoelectric substrate, or such a material that when the support substrate and the piezoelectric substrate are joined, the thermal stress exerted at the interface between the temporary support member and the piezoelectric substrate is smaller than the thermal stress exerted at the interface between the support substrate and the piezoelectric substrate. Consequently, in comparison to related art, it is possible to reduce the possibility of a defect occurring in the piezoelectric thin plate due to thermal stress exerted when separating the piezoelectric thin plate. Further, because the support substrate is formed on the piezoelectric thin plate after heating is performed to split the piezoelectric thin plate, as the material for forming the support substrate, a material with any coefficient of linear expansion may be used without considering the thermal stress that is exerted at the interface between the support substrate and the piezoelectric thin plate.

For this reason, the selectively of the combination of the material for forming the piezoelectric thin plate and the material for forming the support substrate can be increased. For example, for devices used for filter applications, it is possible to improve the temperature-frequency characteristics of the filter by making the coefficient of linear expansion of the material of the support substrate significantly lower than the coefficient of linear expansion of the piezoelectric thin plate. In addition, by selecting a material with high thermal conductivity for the support substrate, it is possible to improve heat radiation property and electric power handling capability. Moreover, by selecting an inexpensive material, it is possible to reduce the manufacturing cost of the resulting device.

Next, heating is applied to facilitate splitting of the piezoelectric substrate 5A at the high concentration ion-implanted portion 5x. As for the heating temperature for facilitating splitting of the piezoelectric substrate 5A at the high concentration ion-implanted portion 5x, in this embodiment, heating is performed by keeping the temperature at about 250° C. to 400° C.

An external force is applied in that state to split the piezoelectric substrate 5A. That is, at the high concentration ion-implanted portion 5x, the piezoelectric thin plate 5 and the remaining piezoelectric substrate portion are separated so as to leave the piezoelectric thin plate 5 illustrated in FIG. 20(d), and then the remaining piezoelectric substrate portion is removed.

After splitting the piezoelectric substrate 5A by heating, it is desirable to apply heating treatment for recovering piezoelectricity as appropriate. As such heating treatment, heating may be maintained for about three hours at a temperature of 400° C. to 500° C.

The heating temperature required for recovering the piezoelectricity mentioned above may be set higher than the above-mentioned heating temperature during the splitting mentioned above. As a result, piezoelectricity can be effectively recovered.

Figure 21A:
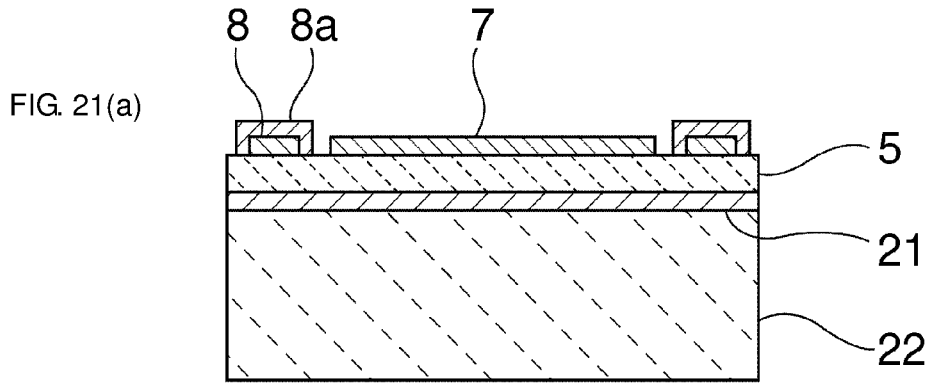
FIGS. 21(a) to 21(c) are schematic elevational cross-sectional views for explaining a method of manufacturing a piezoelectric bulk wave device according to an embodiment of the present invention.

Next, as illustrated in FIG. 21(a), an electrode structure including the second electrode 7 and the line electrode 8 is formed on the piezoelectric thin plate 5 by photolithography. Further, a protective film 8a is formed so as to cover the line electrode 8.

Figure 21B:
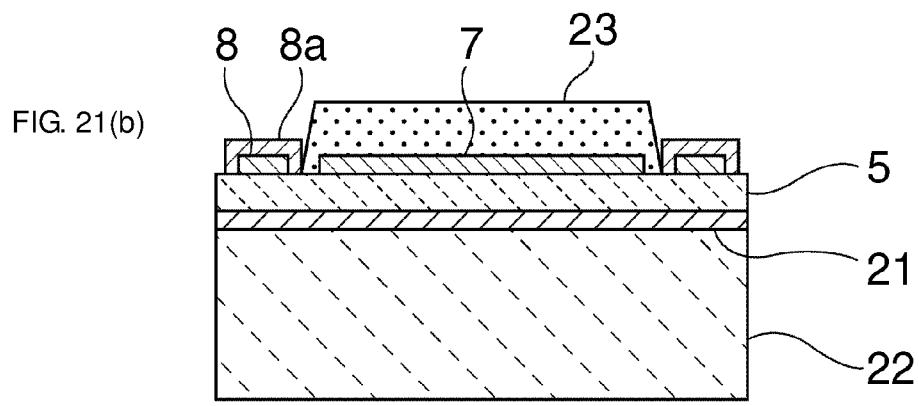

Next, as illustrated in FIG. 21(b), a dummy layer 23 is formed so as to cover the second electrode 7. The dummy layer 23 is made of a material that can be removed by etching. As such a material for forming the dummy layer, an insulating film of SiO$_2$, ZnO, phospho-silicate glass (PSG), or the like, various kinds of organic films, a metal with high selectivity of dissolution in the lower electrode or a passivation film covering the lower electrode, or the like may be used. In this embodiment, Cu is used. As an etchant used for the above-mentioned etching, a suitable material that allows only the dummy layer 23 to be removed by etching without etching the second electrode 7 may be used.

Figure 21C:
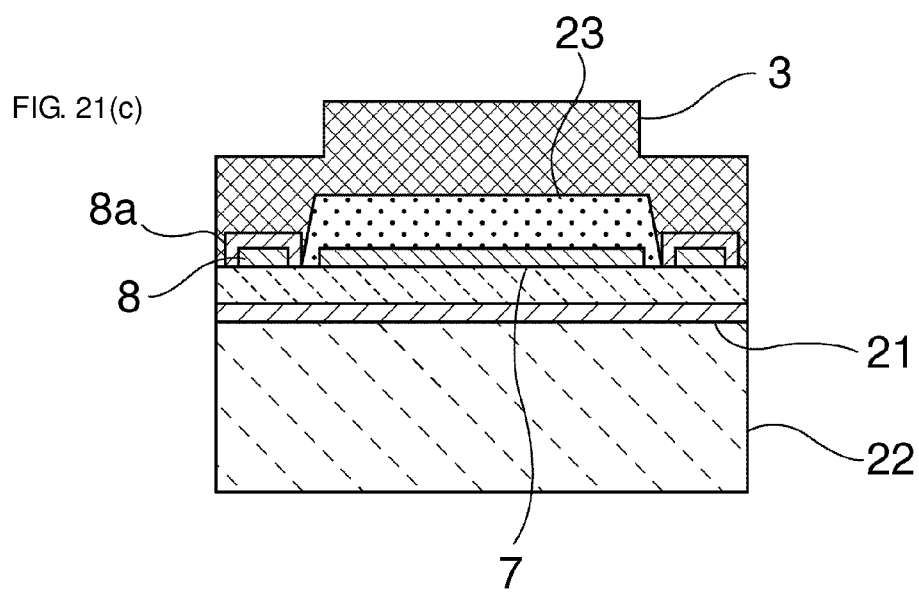

As illustrated in FIG. 21(c), the insulating layer 3 is formed on the entire surface so as to cover the dummy layer 23, the protective film 8a, and the like. The insulating layer 3 may be made of a suitable insulating ceramic such as SiO$_2$, SiN, Ta$_2$O$_5$, or AlN. Alternatively, an insulating material such as glass or resin may be used.

Figure 22A:
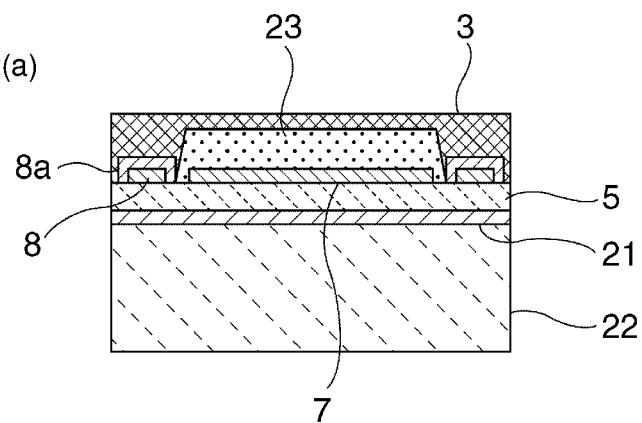
FIGS. 22(a) to 22(c) are schematic elevational cross-sectional views for explaining a method of manufacturing a piezoelectric bulk wave device according to an embodiment of the present invention.

Thereafter, as illustrated in FIG. 22(a), the insulating layer 3 is abraded to flatten its upper surface.

Figure 22B:
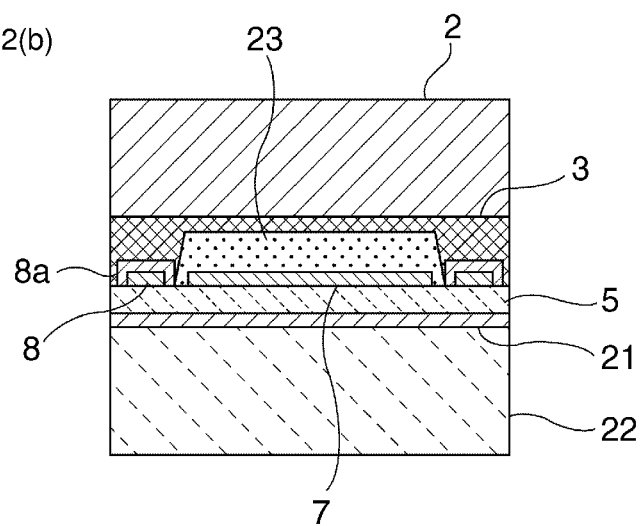

Next, as illustrated in FIG. 22(b), the support substrate 2 is laminated on top of the insulating layer 3 that has been flattened.

Figure 22C:
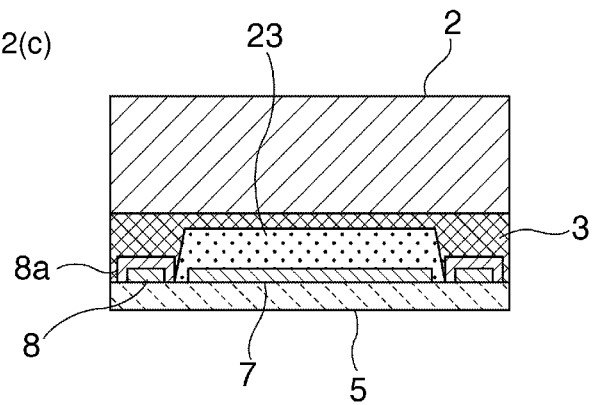
Figure 23A:
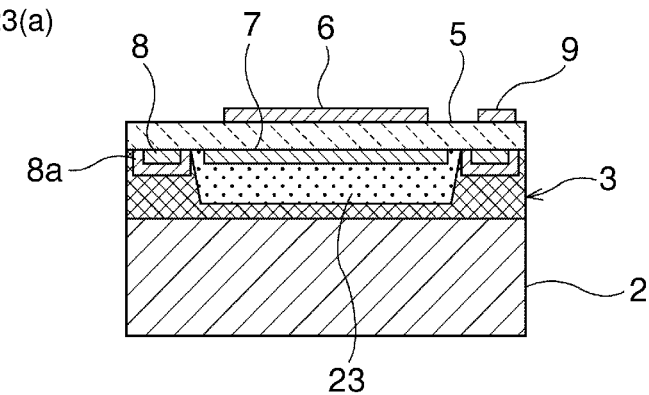
FIGS. 23(a) to 23(c) are schematic elevational cross-sectional views for explaining a method of manufacturing a piezoelectric bulk wave device according to an embodiment of the present invention.

Next, the temporary joining layer 21 mentioned above is removed by etching, and separated from the piezoelectric thin plate 5. Consequently, the piezoelectric thin plate 5 can be detached from the temporary support member 22. In this way, as illustrated in FIG. 22(c), a structure is obtained in which the dummy layer 23, the second electrode 7, and the piezoelectric thin plate 5 are laminated over the lower surface of the support substrate 2 via the insulating layer 3. Next, as illustrated in FIG. 23(a), this structure is turned upside down, and the first electrode 6 and the line electrode 9 are formed on the piezoelectric thin plate 5 by photolithography.

Figure 23B:
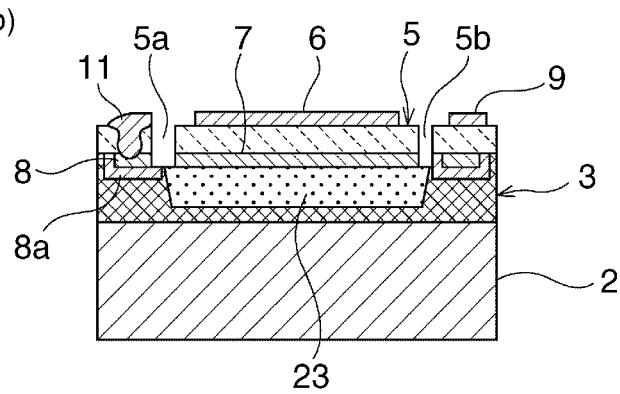

Thereafter, the slits 5a and 5b, and a via-hole-forming electrode hole are formed in the piezoelectric thin plate 5 by etching. Next, as illustrated in FIG. 23(b), the via-hole electrode 11 is formed.

Figure 23C:
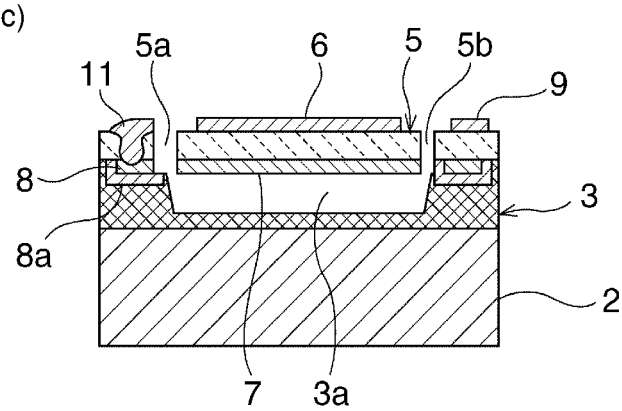
Figure 24:
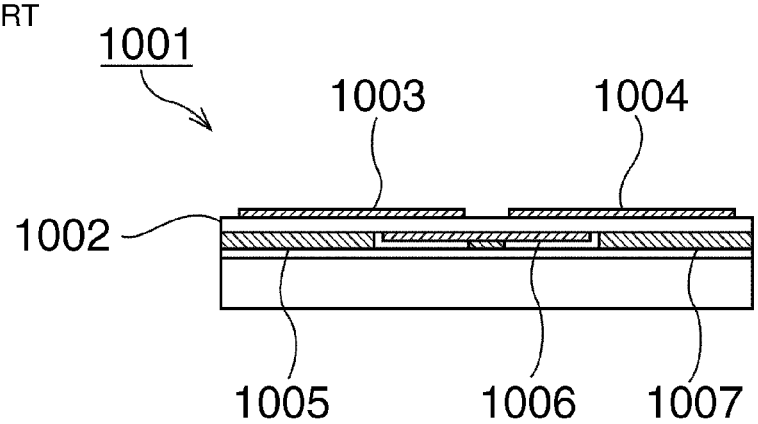
FIG. 24 is a schematic cross-sectional view illustrating an example of a piezoelectric thin film device according to related art.

Thereafter, the dummy layer 23 is removed by etching. In this way, the state illustrated in FIG. 23(c) is obtained, in which the recess 3a is formed, and the piezoelectric thin plate vibrating part 4 is made afloat. Lastly, as illustrated in FIG. 1(a), the bumps 12 and 10 are formed on the via-hole electrode 11 and the line electrode 9, respectively. In this way, the piezoelectric bulk wave device 1 according to the embodiment mentioned above can be provided. According to the above-mentioned manufacturing method, ions are implanted into the piezoelectric substrate 5A having a large thickness in advance. Consequently, the piezoelectric substrate 5A can be easily split at the high concentration ion-implanted portion 5x to thereby obtain the piezoelectric thin plate 5. According to this method, the piezoelectric thin plate 5 with a relatively small thickness can be obtained with high accuracy.

While the piezoelectric bulk wave device according to the present invention can be manufactured by the manufacturing method according to the above-mentioned embodiment, the piezoelectric bulk wave device may be manufactured by other methods.

For example, in the above-mentioned embodiment, the piezoelectric thin plate and the remaining piezoelectric substrate portion are separated from each other after bonding the temporary support member 22 onto one side of the piezoelectric substrate. However, the step of preparing the piezoelectric thin plate may be performed as follows. That is, the piezoelectric thin plate may be prepared by performing the steps of implanting ions from one side of the piezoelectric substrate made of $LiTaO_3$ to form the high concentration ion-implanted portion mentioned above, joining the support substrate to the one side of the piezoelectric substrate, and then separating the piezoelectric substrate at the high concentration ion-implanted portion while heating the piezoelectric substrate, into a piezoelectric thin plate that extends from the one side of the piezoelectric substrate to the high concentration ion-implanted portion, and the remaining substrate portion. More specifically, the piezoelectric substrate 5A having the high concentration ion-implanted portion 5x as illustrated in FIG. 20(a) is prepared by ion implantation. Next, the first electrode is formed on the side of the piezoelectric substrate 5A from which ions have been implanted. Thereafter, the support substrate 2 is joined to the side of the piezoelectric substrate 5A from which ions have been implanted, that is, the side of the piezoelectric substrate 5A on which the first electrode is formed. In that state, while heating the piezoelectric substrate 5A, the piezoelectric substrate 5A is separated into the piezoelectric thin plate and the remaining piezoelectric substrate portion in the same manner as in the embodiment mentioned above. Next, the second electrode may be formed on the side of the piezoelectric thin plate opposite to the side on which the first electrode is formed.

Other than by implanting ions into the piezoelectric substrate made of $LiTaO_3$ and splitting the piezoelectric substrate, the formation of the piezoelectric thin plate may be achieved by abrasion of the piezoelectric substrate, etching of the piezoelectric substrate, or the like.

The above-mentioned piezoelectric bulk wave device 1 is merely an example of piezoelectric bulk wave device according to the present invention. The characteristic feature of the present invention resides in that the first and second electrodes 6 and 7 of the piezoelectric bulk wave device are each formed by a conductor with a specific acoustic impedance higher than the specific acoustic impedance of a transversal wave that propagates in $LiTaO_3$, and further, resonance characteristics according to the thickness shear vibration mode are effectively utilized. Therefore, the material, shape, and the like of the first and second electrodes are not particularly limited. Moreover, the piezoelectric bulk wave device may be configured so as to have an electrode structure that functions not only as a resonator but also as various band-pass filters.

REFERENCE SIGNS LIST 1 piezoelectric bulk wave device
2 support substrate
3 insulating layer
3a recess
4 piezoelectric thin plate vibrating part
5 piezoelectric thin plate
5A piezoelectric substrate
5a, 5b slit
5x high concentration ion-implanted portion
6 first electrode
7 second electrode
8 line electrode
8a protective film
9 line electrode
10 bump
11 via-hole electrode
12 bump
21 temporary joining layer
22 temporary support member
23 dummy layer

The invention claimed is:
1. A piezoelectric bulk wave device comprising:
a piezoelectric plate that is made of $LiTaO_3$; and
first and second electrodes provided in contact with the piezoelectric plate,
wherein the piezoelectric bulk wave device utilizes a thickness shear mode of the piezoelectric plate made of $LiTaO_3$,
wherein the first and second electrodes each comprise a conductor having a specific acoustic impedance higher than a specific acoustic impedance of a transversal wave that propagates in the $LiTaO_3$,
wherein, when a sum of film thicknesses of the first and second electrodes is defined as an electrode thickness, and a thickness of the piezoelectric plate made of $LiTaO_3$ is defined as an LT thickness, the electrode thickness/(electrode thickness+LT thickness) is not less than 5% and not more than 40%, and wherein of Euler Angles ($\phi$, $\theta$, $\phi$) of the LiTaO$_3$, $\theta$ is in a range of not less than 54° and not more than 107°.

2. The piezoelectric bulk wave device according to claim 1, wherein each of the first and second electrodes is at least one metal selected from the group consisting of W, Mo, Pt, and Ta or an alloy mainly including the at least one metal, or a laminate including the at least one metal and that accounts for more than half of the laminate in weight ratio.

3. The piezoelectric bulk wave device according to claim 1, wherein of the Euler Angles ($\phi$, $\theta$, $\phi$) of the LiTaO$_3$, $\phi$ is 0°.

4. The piezoelectric bulk wave device according to claim 3, wherein the $\theta$ of the Euler Angles of the LiTaO$_3$ is in a range of 55° to 85°.

5. The piezoelectric bulk wave device according to claim 3, wherein the $\theta$ of the Euler Angles of the LiTaO$_3$ is in a range of 63° to 97°.

6. The piezoelectric bulk wave device according to claim 1, further comprising:
   a support substrate; and
   an insulating layer on the support substrate, the insulating layer defining a recess,
   the piezoelectric plate being disposed above the recess.

7. A method of manufacturing a piezoelectric bulk wave device, the method comprising:
   preparing a piezoelectric plate that is made of LiTaO$_3$;
   forming a first electrode in contact with the piezoelectric plate, the first electrode being formed by a conductor having a specific acoustic impedance higher than a specific acoustic impedance of a transversal wave that propagates in the LiTaO$_3$; and
   forming a second electrode in contact with the piezoelectric plate, the second electrode being formed by a conductor having a specific acoustic impedance higher than the specific acoustic impedance of the transversal wave that propagates in the LiTaO$_3$,
   wherein the piezoelectric bulk wave device utilizes a thickness shear mode of the piezoelectric plate made of LiTaO$_3$,
   wherein, when a sum of thicknesses of the first and second electrodes is defined as an electrode thickness, and a thickness of the piezoelectric plate made of LiTaO$_3$ is defined as an LT thickness, the electrode thickness/(electrode thickness+LT thickness) is not less than 5% and not more than 40%, and
   wherein the piezoelectric plate made of LiTaO$_3$ is prepared so as to have Euler Angles ($\phi$, $\theta$, $\phi$), of which $\theta$ is in a range of not less than 54° and not more than 107°.

8. The method of manufacturing a piezoelectric bulk wave device according to claim 7, wherein the step of preparing the piezoelectric plate includes:
   implanting ions from a first side of a piezoelectric substrate made of LiTaO$_3$ to form a high concentration ion-implanted portion on the first side, the high concentration ion-implanted portion being a portion of highest implanted-ion concentration;
   joining a support substrate to the first side of the piezoelectric substrate; and
   separating the piezoelectric substrate at the high concentration ion-implanted portion, while heating the piezoelectric substrate, into the piezoelectric plate that extends from the first side of the piezoelectric substrate to the high concentration ion-implanted portion, and a remaining piezoelectric substrate portion.

9. The method of manufacturing a piezoelectric bulk wave device according to claim 7, wherein:
   the step of preparing the piezoelectric plate includes
   implanting ions from a first side of a piezoelectric substrate made of LiTaO$_3$ to form a high concentration ion-implanted portion on the first side, the high concentration ion-implanted portion being a portion of highest implanted-ion concentration,
   bonding a temporary support member onto the first side of the piezoelectric substrate, and
   separating the piezoelectric substrate at the high concentration ion-implanted portion, while heating the piezoelectric substrate bonded on the temporary support member, into the piezoelectric plate that extends from the first side of the piezoelectric substrate to the high concentration ion-implanted portion, and a remaining piezoelectric substrate portion; and
   detaching the temporary support member from the piezoelectric plate.

10. The method of manufacturing a piezoelectric bulk wave device according to claim 9, wherein:
    prior to detaching the temporary support member from the piezoelectric plate, the steps of forming a first electrode on the piezoelectric plate, forming a dummy layer to cover the first electrode, and laminating a support substrate on the dummy layer are performed; and
    after detaching the temporary support member from the piezoelectric plate, forming a second electrode on a second side of the piezoelectric plate which is exposed by the detaching of the temporary support member, and causing the dummy layer to disappear.

11. The method of manufacturing a piezoelectric bulk wave device according to claim 7, wherein, of the Euler Angles ($\phi$, $\theta$, $\phi$), $\theta$ is 0°.

12. The method of manufacturing a piezoelectric bulk wave device according to claim 11, wherein the $\theta$ of the Euler Angles is in a range of 55° to 85°.

13. The method of manufacturing a piezoelectric bulk wave device according to claim 11, wherein the $\theta$ of the Euler Angles is in a range of 63° to 97°.

14. The piezoelectric bulk wave device according to claim 1, further comprising:
    a support substrate;
    an insulating layer on the support substrate, wherein the piezoelectric plate is on or above the insulting layer; and
    a line electrode on the insulating layer,
    wherein the line electrode is connected to the second electrode, and the line electrode is spaced apart from a joint interface between the insulating layer and the support substrate.

15. The piezoelectric bulk wave device according to claim 1, further comprising:
    a first line electrode on the piezoelectric plate;
    a first gold bump on the first line electrode;
    a second line electrode on the piezoelectric plate;
    a via-hole electrode in the piezoelectric plate and electrically connected to the second line electrode; and
    a second gold bump joined to an end of the via-hole electrode.

16. The piezoelectric bulk wave device according to claim 1, further comprising:
    a support substrate;
    an insulating layer on the support substrate, wherein the piezoelectric plate is on or above the insulting layer; and
    a recess between the piezoelectric plate and the insulting layer, wherein a vibrating part of the piezoelectric plate is disposed above the recess.

* * * * *